United States Patent
Kang et al.

(10) Patent No.: US 11,832,480 B2
(45) Date of Patent: *Nov. 28, 2023

(54) DISPLAY APPARATUS

(71) Applicant: Samsung Display Co., Ltd., Yongin-si (KR)

(72) Inventors: Chulkyu Kang, Yongin-si (KR); Sangmoo Choi, Yongin-si (KR); Wonkyu Kwak, Yongin-si (KR); Jinwoo Park, Yongin-si (KR); Dongsun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/988,896

(22) Filed: Aug. 10, 2020

(65) Prior Publication Data
US 2020/0373369 A1 Nov. 26, 2020

Related U.S. Application Data

(63) Continuation of application No. 16/352,262, filed on Mar. 13, 2019, now Pat. No. 10,741,625.

(30) Foreign Application Priority Data

Mar. 13, 2018 (KR) .................. 10-2018-0029280

(51) Int. Cl.
*G09G 3/32* (2016.01)
*H10K 59/121* (2023.01)
*G09G 3/3233* (2016.01)
*H10K 59/123* (2023.01)
(Continued)

(52) U.S. Cl.
CPC ....... *H10K 59/1213* (2023.02); *G09G 3/3233* (2013.01); *H10K 59/123* (2023.02);
(Continued)

(58) Field of Classification Search
CPC ............ H01L 27/3262; H01L 51/0097; H01L 27/3248; H01L 27/3258; H01L 27/3265;
(Continued)

(56) References Cited

U.S. PATENT DOCUMENTS 7,247,881 B2  7/2007 Lee et al.
8,664,036 B2  3/2014 Yamazaki et al.
(Continued)

FOREIGN PATENT DOCUMENTS

KR  10-2005-0049999  5/2005
KR  10-2015-0046646  4/2015
(Continued)

*Primary Examiner* — Lunyi Lao
*Assistant Examiner* — Jarurat Suteerawongsa
(74) *Attorney, Agent, or Firm* — KILE PARK REED & HOUTTEMAN PLLC

(57) ABSTRACT

A display apparatus includes a substrate including a display area; a first thin film transistor arranged on the display area of the substrate and having a first semiconductor layer including a silicon semiconductor and a first gate electrode insulated from the first semiconductor layer by a first gate insulating layer; a second thin film transistor arranged on the display area of the substrate and having a second semiconductor layer including an oxide semiconductor and a second gate electrode insulated from the second semiconductor layer; and a storage capacitor at least partially overlapping the first thin film transistor and having a lower electrode and an upper electrode, wherein the second semiconductor layer and one of the lower electrode and the upper electrode are arranged on a same layer.

21 Claims, 12 Drawing Sheets

(51) Int. Cl.
  *H10K 59/124* (2023.01)
  *H10K 59/131* (2023.01)
  *H10K 77/10* (2023.01)
  *H01L 29/786* (2006.01)
  *H01L 27/12* (2006.01)
  *H10K 102/00* (2023.01)

(52) U.S. Cl.
  CPC ....... *H10K 59/124* (2023.02); *H10K 59/1216* (2023.02); *H10K 59/131* (2023.02); *H10K 77/111* (2023.02); *G09G 2300/0426* (2013.01); *G09G 2320/0242* (2013.01); *G09G 2330/021* (2013.01); *H01L 27/124* (2013.01); *H01L 27/1225* (2013.01); *H01L 27/1251* (2013.01); *H01L 27/1255* (2013.01); *H01L 29/7869* (2013.01); *H01L 29/78675* (2013.01); *H10K 2102/311* (2023.02)

(58) Field of Classification Search
  CPC .......... H01L 27/3276; H01L 29/78675; H01L 2251/5338; H01L 27/1225; H01L 27/124; H01L 27/1251; H01L 27/1255; H01L 29/7869; H01L 27/1218; H01L 29/786; H01L 51/50; G09G 3/3233; G09G 2320/0242; G09G 2330/021; G09G 2300/0426; Y02P 70/50; Y02E 10/549
  See application file for complete search history.

(56) References Cited

U.S. PATENT DOCUMENTS

| | | | |
|---|---|---|---|
| 9,484,467 B2 | 11/2016 | Yamazaki et al. | |
| 9,748,397 B2 | 8/2017 | Shen et al. | |
| 9,806,105 B2 * | 10/2017 | Kim | H01L 29/78675 |
| 9,911,379 B2 | 3/2018 | Kim et al. | |
| 9,941,339 B2 | 4/2018 | Her | |
| 10,002,916 B2 | 6/2018 | Shin et al. | |
| 10,186,529 B2 | 1/2019 | Noh | |
| 10,270,059 B2 * | 4/2019 | Kim | H10K 50/844 |
| 10,741,625 B2 * | 8/2020 | Kang | H01L 27/3262 |
| 2006/0119753 A1 | 6/2006 | Luo et al. | |
| 2010/0140613 A1 * | 6/2010 | Kimura | H01L 27/1288 257/43 |
| 2014/0217397 A1 * | 8/2014 | Kwak | H01L 27/1218 257/43 |
| 2015/0108438 A1 | 4/2015 | Kim | |
| 2016/0005803 A1 * | 1/2016 | Ryu | H10K 50/844 257/40 |
| 2016/0005804 A1 * | 1/2016 | Oh | H01L 27/3262 438/239 |
| 2016/0155762 A1 * | 6/2016 | Sato | H01L 29/42384 257/71 |
| 2017/0012056 A1 * | 1/2017 | Lee | H01L 27/124 |
| 2017/0170206 A1 * | 6/2017 | Lee | H01L 29/78633 |
| 2018/0130910 A1 * | 5/2018 | Yoshitani | H01L 27/3262 |
| 2018/0254005 A1 | 9/2018 | Sagawa et al. | |

FOREIGN PATENT DOCUMENTS

| | | |
|---|---|---|
| KR | 10-2015-0101415 | 9/2015 |
| KR | 10-2015-0105586 | 9/2015 |
| KR | 10-2016-0090949 | 8/2016 |
| KR | 10-2017-0018197 | 2/2017 |
| KR | 10-2017-0024200 | 3/2017 |
| KR | 10-2017-0026744 | 3/2017 |
| KR | 10-2017-0049666 | 5/2017 |

* cited by examiner

DISPLAY APPARATUS

CROSS-REFERENCE TO RELATED APPLICATION(S)

This is a continuation application based on currently pending U.S. patent application Ser. No. 16/352,262, filed on Mar. 13, 2019, the disclosure of which is incorporated herein by reference in its entirety. U.S. patent application Ser. No. 16/352,262 claims priority benefit of Korean Patent Application No. 10-2018-0029280, filed on Mar. 13, 2018 in the Korean Intellectual Property Office, the disclosure of which is incorporated herein by reference in its entirety for all purposes.

BACKGROUND

1. Field

One or more embodiments herein relate to a display apparatus, and more particularly, to a display apparatus driven by a thin film transistor including a silicon semiconductor and a thin film transistor including an oxide semiconductor.

2. Description of the Related Art

Generally, a display apparatus includes a display device and a driving circuit for controlling electrical signals for the display device. The driving circuit includes a plurality of thin film transistors (TFTs), a storage capacitor, and a plurality of wires.

Recently, to accurately control luminescence intensities of display devices, the number of TFTs for each display device has increased. As the result, the display devices require, for example, high integration density, low power consumption, low process cost, short process time, and the like.

SUMMARY

Embodiments are directed to a display apparatus including a substrate including a display area; a first thin film transistor arranged on the display area of the substrate, the first thin film transistor having a first semiconductor layer including a silicon semiconductor and a first gate electrode insulated from the first semiconductor layer by a first gate insulating layer; a second thin film transistor arranged on the display area of the substrate, the second thin film transistor having a second semiconductor layer including an oxide semiconductor and a second gate electrode insulated from the second semiconductor layer; and a storage capacitor at least partially overlapping the first thin film transistor, the storage capacitor having a lower electrode and an upper electrode. The second semiconductor layer and one of the lower electrode and the upper electrode may be arranged on a same layer.

The display apparatus may further include a second gate insulating layer arranged between the first gate electrode and the second semiconductor layer in a horizontal direction. The lower electrode of the storage capacitor and the first gate electrode of the first thin film transistor may be formed in one same body, and the upper electrode of the storage capacitor may be arranged on the second gate insulating layer.

The second semiconductor layer of the second thin film transistor may include a second channel area, a second source area, and a second drain area. The second source area and the second drain area may be respectively arranged at two opposite sides of the second channel area. The upper electrode of the storage capacitor and at least one of the second source area and the second drain area may include a same material.

The display apparatus may further include a display device driven by the first thin film transistor and the second thin film transistor. The first thin film transistor may include a driving thin film transistor to supply a driving current to the display device.

The display apparatus may further include a first wire in the display area. The first wire and the upper electrode of the storage capacitor may be arranged on a same layer, and may include a same material.

The display apparatus may further include a second wire in the display area. The second wire and the first gate electrode may be arranged on a same layer and may include a same material.

The display apparatus may further include a second gate insulating layer arranged between the first gate electrode and the second semiconductor layer in a horizontal direction; and a third gate insulating layer arranged between the second semiconductor layer and the second gate electrode. The lower electrode of the storage capacitor and the second semiconductor layer may be arranged on a same layer. A dielectric layer of the storage capacitor and the third gate insulating layer may be formed of a same material. The upper electrode of the storage capacitor and the second gate electrode of the second thin film transistor may be arranged on a same layer as.

According to one or more embodiments, the display apparatus may include a substrate including a first area, a second area, and a bending area between the first area and the second area and bent with respect to a bending axis; a first thin film transistor, a second thin film transistor, and a storage capacitor arranged in the first area of the substrate; a connection wire extending from the first area to the second area across the bending area; and an inner wire and an outer wire respectively connected to the connection wire and spaced apart from each other by the bending area. The first thin film transistor may have a first semiconductor layer including a silicon semiconductor and a first gate electrode insulated from the first semiconductor layer by a first gate insulating layer. The second thin film transistor may have a second semiconductor layer including an oxide semiconductor and a second gate electrode insulated from the second semiconductor layer by a third gate electrode. The second semiconductor layer and one of a lower electrode and an upper electrode of the storage capacitor may be arranged on a same layer.

The display apparatus may further include a display device driven by the first thin film transistor and the second thin film transistor. The first thin film transistor may include a driving thin film transistor to supply a driving current to the display device.

The storage capacitor may at least partially overlap the first thin film transistor in a vertical direction.

The display apparatus may further include a second gate insulating layer arranged between the first gate electrode of the first thin film transistor and the second semiconductor layer in a horizontal direction. The lower electrode of the storage capacitor and the first gate electrode of the first thin film transistor may be formed in one body. The upper electrode of the storage capacitor may be arranged on the second gate insulating layer.

Parts of the inner wire and the outer wire may be arranged on a same layer. The inner wire, the outer wire, and the first gate electrode may include a same material.

Parts of the inner wire and the outer wire may be arranged on a same layer. The inner wire, the outer wire, and the second gate electrode may include a same material.

The display apparatus may further include a third gate insulating layer between the second semiconductor layer and the second gate electrode. The third gate insulating layer may be arranged below the inner wire. A width of the third gate insulating layer arranged below the inner wire may be substantially identical to a width of the inner wire.

The display apparatus may further include an interlayer insulating layer arranged on the substrate and covering the second gate electrode; a first electrode arranged on the interlayer insulating layer and connected to the first semiconductor layer; and a planarization layer covering the first electrode.

The display apparatus may further include a connection electrode arranged on the planarization layer and connected to the first electrode via contact holes defined in the planarization layer. The connection wire and the connection electrode may include a same material.

The display apparatus may further include an inorganic insulating layer including an opening or a groove corresponding to the bending area. The organic material layer may fill the opening or the groove of the inorganic insulating layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
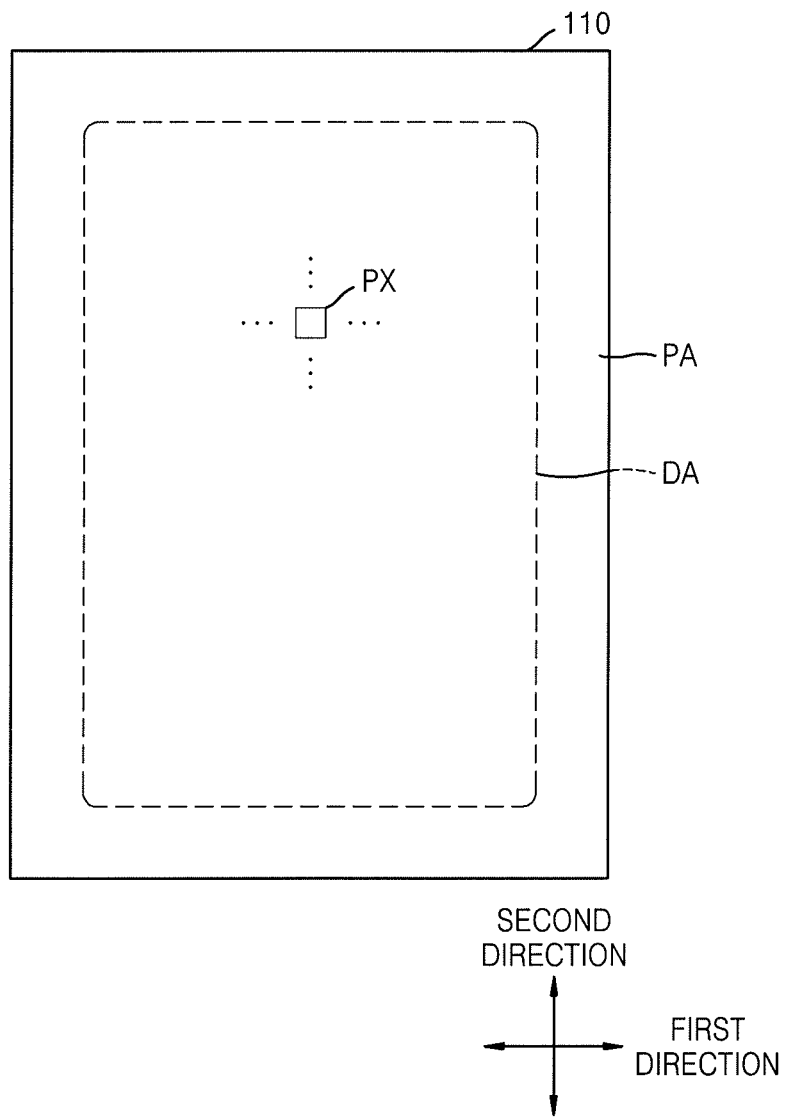
FIG. 1 illustrates a top-plan view of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As the present disclosure allows for various changes and numerous embodiments, particular embodiments will be illustrated in the drawings and described in detail in the written description. The advantages and features of the present disclosure and methods of achieving the advantages and features will be described more fully with reference to the accompanying drawings, in which exemplary embodiments of the present disclosure are shown. The present disclosure may, however, be embodied in many different forms and should not be construed as limited to the exemplary embodiments set forth herein.

Reference will now be made in detail to embodiments, examples of which are illustrated in the accompanying drawings, wherein like reference numerals refer to like elements throughout, and overlapping description will be omitted. As used herein, the term "and/or" includes any and all combinations of one or more of the associated listed items. Expressions such as "at least one of," when preceding a list of elements, modify the entire list of elements and do not modify the individual elements of the list.

Although the terms "first," "second" may be used herein to describe various elements, these elements should not be limited by these terms, and these terms are only used to distinguish one element from another.

The singular forms "a," "an," and "the" are intended to include the plural forms as well, unless the context clearly indicates otherwise.

It will be further understood that the terms "comprises" and/or "comprising" used herein specify the presence of the stated features or components, but do not preclude the presence or addition of one or more other features or components.

Sizes of elements may be exaggerated for convenience of explanation. In other words, since sizes and thicknesses of elements in the drawings are arbitrarily illustrated for convenience of explanation, the present disclosure is not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or element is referred to as being "connected" to another layer, region, or element, it may be directly or indirectly connected to the other layer, region, or element. That is, intervening layers, regions, elements may be present. For example, when a layer, region, or element is electrically connected to another layer, region, or element, the layer, region, or element may be directly and electrically connected to the other layer, region, or element, or intervening layers, regions, elements may be present.

FIG. 1 illustrates a top-plan view of a display apparatus according to an embodiment.

In a display area DA of a substrate 110, pixels PXs respectively including various kinds of display devices, e.g., an organic light-emitting device (OLED), may be arranged. Various kinds of wires for supplying electrical signals to the display area DA may be arranged in a peripheral area PA of the substrate 110. In other embodiments, the present disclosure may be applied to various kinds of display apparatuses, e.g., a liquid crystal display (LCD), an electrophoretic image display, an electro luminance display, and the like.

Figure 2:
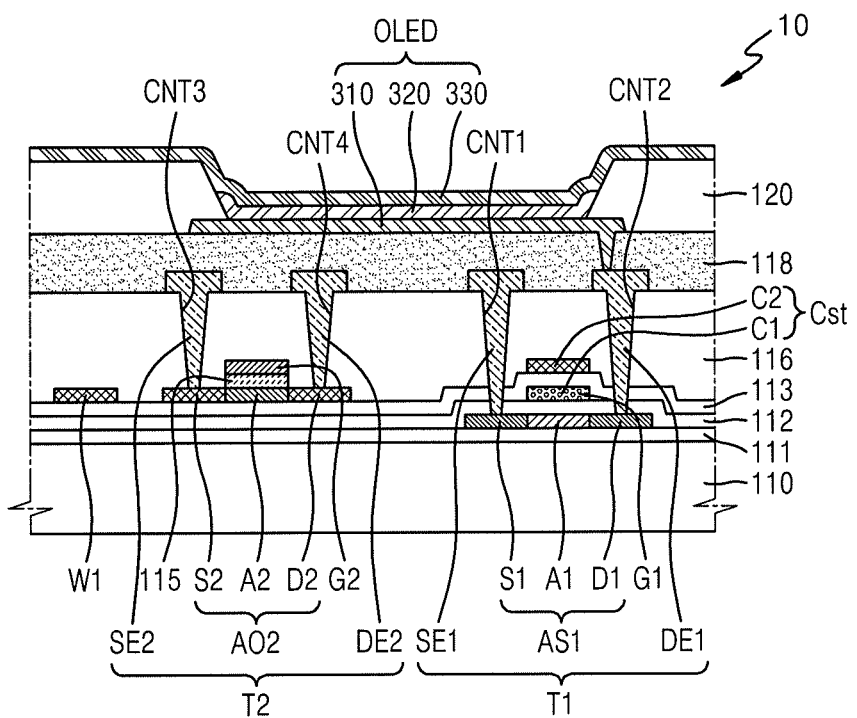
FIG. 2 illustrates a cross-sectional view of a part of the display apparatus according to an embodiment.

FIG. 2 illustrates a cross-sectional view of a part of the display device of the display apparatus according to an embodiment.

Referring to FIG. 2, a display apparatus 10 according to an embodiment may include a first thin film transistor T1 including a silicon semiconductor, a second thin film transistor T2 including an oxide semiconductor, and a storage capacitor Cst at least partially overlapping the first thin film transistor T1 and including an upper electrode C2 and a lower electrode C1. Further, a second semiconductor layer AO2 of the second thin film transistor T2 and one of the upper electrode C2 and the lower electrode C1 of the storage capacitor Cst may be arranged on the same layer. For example, as illustrated in FIG. 2, the second semiconductor layer AO2 of the second thin film transistor T2 and the upper electrode C2 of the storage capacitor Cst may be arranged on the same layer. For example, the second semiconductor layer AO2 of the second thin film transistor T2 and the lower electrode C1 of the storage capacitor Cst may have the same level from the substrate 110. For example, the second semiconductor layer AO2 of the second thin film transistor T2 may be at a higher level from the substrate 110 than the first semiconductor layer AS1 of the first thin film transistor T1.

The first thin film transistor T1 may include a first semiconductor layer AS1 including a silicon semiconductor and a first gate electrode G1 insulated from the first semiconductor layer AS1. The first thin film transistor T1 may include a first source electrode SE1 and a first drain electrode DE1 connected to the first semiconductor layer AS1. The first thin film transistor T1 may function as a driving thin film transistor in, e.g., a driving circuit.

The second thin film transistor T2 may include the second semiconductor layer AO2 including an oxide semiconductor and a second gate electrode G2 insulated from the second semiconductor layer AO2. The second thin film transistor T2 may include a second source electrode SE2 and a second drain electrode DE2 connected to the second semiconductor layer AO2. The second thin film transistor T2 may function as a switching thin film transistor. In other embodiments, the second thin film transistor T2 may be any kind of thin film transistor other than the driving thin film transistor in the driving circuit. For example, the first semiconductor layer AS1 of the first thin film transistor T1 may be closer to the substrate 110 than the second semiconductor layer AO2 of the second thin film transistor T2.

According to an embodiment, the first semiconductor layer AS1 of the first thin film transistor T1 (e.g., that functions as the driving thin film transistor) may include polycrystalline silicon having high reliability, and the second semiconductor layer AS2 of the second thin film transistor T2 (e.g., that functions as the switching thin film transistor) may include an oxide semiconductor layer having low leakage current.

For example, when a driving thin film transistor (e.g., that directly affects a brightness of the display device) of a display apparatus includes a semiconductor layer including, e.g., polycrystalline silicon having high reliability, the display apparatus may have a high resolution or a high definition due to the high reliability of the driving thin film transistor.

For example, when a thin film transistor has a semiconductor layer including an oxide semiconductor, which has high carrier mobility and low leakage current, the thin film transistor may not have a great voltage drop for a long driving time. In other words, when the thin film transistor including the oxide semiconductor may be driven by low frequency, the thin film transistor may have a low voltage drop such that there are not significant color changes in images due to the low voltage drop of the thin film transistor at the low frequency operation. Thus, power consumption of a driving circuit including the thin film transistor having a semiconductor layer including the oxide semiconductor may be lower than power consumption of a driving circuit including thin film transistors having a semiconductor layer including polycrystalline silicon.

In the embodiments, when at least one of other thin film transistors of the display apparatus, except for the driving thin film transistor thereof, includes a semiconductor layer (i.e., an active layer) including an oxide semiconductor, the power consumption of the display apparatus may be reduced. For example, as the number of thin film transistors having semiconductor layers including an oxide semiconductor increases, the power consumption of the display apparatus may be decreased.

According to the embodiments, the display apparatus may include the storage capacitor Cst overlapping the first thin film transistor T1 such that the display apparatus may have high integration density. Further, by arranging the second semiconductor layer AO2 and one of the upper electrode C2 and the lower electrode C1 of the storage capacitor Cst on the same layer, process time and process cost for the display apparatus may be reduced.

Hereinafter, referring to FIG. 2, components included in the display apparatus will be described according to a stack order of the components on the substrate 110.

The substrate 110 may include, e.g., a glass material, a ceramic material, a metal material, or a flexible or bendable material. For example, when the substrate 110 is flexible or bendable, the substrate 110 may include a polymer, e.g., polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). For example, the substrate 110 may have a single-layer or a multi-layer structure formed of the aforementioned materials. When the substrate 110 has the multi-layer structure, the substrate 110 may include, e.g., an inorganic material layer. In some embodiment, the substrate 110 may have a multi-layer structure that an organic material layer, an inorganic material layer, and an organic material layer are sequentially stacked.

A buffer layer 111 may enhance smoothness of an upper surface of the substrate 110, and may be formed of an oxide film (e.g., silicon oxide (SiOx)) and/or a nitride film (e.g., silicon nitride (SiNx)).

A barrier layer (not shown) may be further included between the substrate 110 and the buffer layer 111. The barrier layer may prevent or minimize impurities from the substrate 110, and the like, permeating into the first semiconductor layer AS1 of the first thin film transistor T1. The barrier layer may include inorganic materials, e.g., oxides or nitrides, organic materials, or compounds of organic materials and inorganic materials, and may have a single-layer structure or a multi-layer structure including, e.g., inorganic materials and organic materials.

The first semiconductor layer AS1 of the first thin film transistor T1 including the silicon semiconductor may be arranged on the buffer layer 111, and may include a first source area S1 and a first drain area D1 separated from each other, and a first channel area A1 arranged between the first source area S1 and the first drain area D1.

The first semiconductor layer AS1 of the first thin film transistor T1 may include, e.g., polycrystalline silicon. The first source area S1 and the first drain area D1 may be doped with impurities, and may have conductivity. The first source area S1 and the first drain area D1 of the first semiconductor layer AS1 may respectively connected to a first source electrode SE1 and a first drain electrode DE1 through a first contact hole CNT1 and a second contact hole CNT2. In an embodiment, positions of the first source area S1 and the first drain area D1 of the first thin film transistor T1 may be exchanged with each other.

The first gate electrode G1 of the first thin film transistor T1 may be arranged above the first semiconductor layer AS1. A first gate insulating layer 112 may be arranged between the first semiconductor layer AS1 and the first gate electrode G1 of the first thin film transistor T1.

The first gate insulating layer 112 may include an inorganic material including, e.g., an oxide or a nitride. For example, the first gate insulating layer 112 may include, e.g., silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate electrode G1 of the first thin film transistor T1, which overlaps the first channel area A1, may include, e.g., molybdenum (Mo), copper (Cu), and titanium (Ti), and may have a single-layer structure or a multi-layer structure.

The storage capacitor Cst may overlap the first gate electrode G1 of the first thin film transistor T1. The storage capacitor Cst may include the lower electrode C1 and the upper electrode C2. A second gate insulating layer 113 may be arranged between the lower electrode C1 and the upper electrode C2 of the storage capacitor Cst. The first gate electrode G1 may function not only as the first gate electrode G1 of the first thin film transistor T1 but also as the lower electrode C1 of the storage capacitor Cst. For example, the first gate electrode G1 of the first thin film transistor T1 and the lower electrode C1 of the storage capacitor Cst may be formed in one body. The upper electrode C2 of the storage capacitor Cst may be arranged on the second gate insulating layer 113 to at least partially overlap the lower electrode C1 of the storage capacitor Cst. The upper electrode C2 of the storage capacitor Cst may be electrically connected to a driving voltage line for supplying a driving voltage. For example, the upper electrode C2 of the storage capacitor Cst may be formed as a part of a mesh wire crossing the driving voltage line, and may supply the driving voltage. For example, the second gate insulating layer 113 may arranged between the first gate electrode G1 of the first thin film transistor T1 and the second semiconductor layer AO2 of the second thin film transistor T2 in a horizontal direction parallel to a top surface of the substrate 110.

The second gate insulating layer 113 may include an inorganic material layer including, e.g., an oxide or a nitride. For example, the second gate insulating layer 113 may include, e.g., $SiO_2$, SiNx, SiON, $Al_2O_3$, $TiO_2$, $Ta_2O_5$, $HfO_2$, or $ZnO_2$, and so on.

The second semiconductor layer AO2 of the second thin film transistor T2 (e.g., that includes the oxide semiconductor layer and does not overlap the upper electrode C2 of the storage capacitor Cst in a vertical direction) may be arranged on the second gate insulating layer 113. The second semiconductor layer AO2 may include a second source area S2 and a second drain area D2 (e.g., that may have conductivity and may be separated from each other), and a second channel area A2 arranged between the second source area S2 and the second drain area D2. The second source area S2 and the second drain area D2 may respectively be connected to a second source electrode SE2 and a second drain electrode DE2 through a third contact hole CNT3 and a fourth contact hole CNT4. In an embodiment, positions of the second source area S2 and the second drain area D2 of the second thin film transistor T2 may be exchanged with each other.

The second semiconductor layer AO2 of the second thin film transistor T2 may include a ZnO-based material, e.g., ZnO, indium (In)—ZnO, gallium (Ga)—In—ZnO, and so on. In some embodiments, the second semiconductor layer AO2 may be an In—Ga—ZnO (IGZO) semiconductor including metals, e.g., In and Ga in ZnO.

The second source area S2 and the second drain area D2 of the second thin film transistor T2 may be formed by a conductivizing process, e.g., by adjusting carrier concentration of the oxide semiconductor. For example, the second source area S2 and the second source drain area D2 of the second thin film transistor T2 may be formed by increasing the carrier concentration of the oxide semiconductor using a plasma treatment with, e.g., hydrogen-based gases, fluorine-based gases, or combinations thereof.

The upper electrode C2 of the storage capacitor Cst and the second semiconductor layer AO2 may be formed of the same material, and may be formed on the same layer. For example, the upper electrode C2 of the storage capacitor Cst and at least one of the second source area S2 and the second drain area D2 of the second thin film transistor T2 may include the same material. In other words, the upper electrode C2 of the storage capacitor Cst may be formed by a conductivizing process, e.g., by adjusting carrier concentration of the oxide semiconductor. For example, the upper electrode C2 of the storage capacitor Cst may be formed by increasing the carrier concentration of the oxide semiconductor using a plasma treatment with, e.g., hydrogen-based gases, fluorine-based gases, or combinations thereof.

A first wire W1 may include the same material as the upper electrode C2 of the storage capacitor Cst and the second semiconductor layer AO2 of the second thin film transistor T2. The first wire W1 may be arranged on the second gate insulating layer 113. The first wire W1 may supply signals, e.g., an initialization voltage, to the first thin film transistor T1 via the second thin film transistor T2 or another thin film transistor (not shown). For example, the first wire W1 and the second semiconductor layer AO2 of the second thin film transistor T2 may have the same level from the substrate 110.

The first wire W1 and the second semiconductor layer AO2 of the second thin film transistor T2 may be formed of the same material, and may be formed on the same layer, e.g., the second gate insulating layer 113. For example, the first wire W1 and at least one of the second source area S2 and the second drain area D2 may be formed of the same material. In other words, the first wire W1 may be formed by a conductivizing process, e.g., by adjusting carrier concentration of the oxide semiconductor. For example, the first wire W1 may be formed by increasing the carrier concentration of the oxide semiconductor using a plasma treatment with, e.g., hydrogen-based gases, fluorine-based gases, or combinations thereof.

The second gate electrode G2 of the second thin film transistor T2 may be arranged above the second semiconductor layer AO2, and a third gate insulating layer 115 may be arranged between the second semiconductor layer AO2 and the second gate electrode G2. The second gate electrode G2 of the second thin film transistor T2 may overlap the second channel area A2, and may be insulated from the second semiconductor layer AO2 by the third gate insulating layer 115.

As the third gate insulating layer 115 and the second gate electrode G2 may be formed by a process using the same mask, a side of the third gate insulating layer 115 may be arranged on the same plane as a side of the second gate electrode G2. In other words, the side of the third gate insulating layer 115 may be aligned to the side of the second gate electrode G2 in a vertical direction. For example, in a horizontal direction, a width of the third gate insulating layer 115 may substantially be identical to a width of the second gate electrode G2.

The third gate insulating layer 115 may include an inorganic material including, e.g., an oxide or a nitride. For example, the third gate insulating layer 115 may include, e.g., $SiO_2$, $SiNx$, $SiON$, $Al_2O_3$, $TiO_2$, $Ta_2O_5$, $HfO_2$, or $ZnO_2$, and so on. The second gate electrode G2 may be arranged on the third gate insulating layer 115, and may include, e.g., Mo, Cu, Ti, and the like. In some embodiments, the second gate electrode G2 may have a single-layer structure or a multi-layer structure. The second gate electrode G2 may be connected to a scan line for supplying scan signals to the second thin film transistor T2.

An interlayer insulating layer 116 may be arranged on the second gate electrode G2, and the first source electrode SE1 and/or the first drain electrode DE1 connected to the first semiconductor layer AS1 and the second electrode SE2 and/or the second drain electrode DE2 connected to the second semiconductor layer AO2. A data line for supplying a data signal and a driving voltage line for supplying a driving voltage may be arranged on the interlayer insulating layer 116. The first source electrode SE1, the first drain electrode DE1, the second source electrode SE2, or the second drain electrode DE2 may be connected to the data line or the driving voltage line directly or via another thin film transistor.

The interlayer insulating layer 116 may include an inorganic material including, e.g., an oxide or a nitride. For example, the interlayer insulating layer 116 may include, e.g., $SiO_2$, $SiNx$, $SiON$, $Al_2O_3$, $TiO_2$, $Ta_2O_5$, $HfO_2$, or $ZnO_2$, and the like.

The first source electrode SE1 and/or the first drain electrode DE1, and the second source electrode SE2 and/or the second drain electrode DE2 may include materials having high conductivity, e.g., metals or conductive oxides. For example, the first source electrode SE1 and/or the first drain electrode DE1 and the second source electrode SE2 and/or the second drain electrode DE2 may respectively have single-layer structures or multi-layer structures including, e.g., Al, Cu, Ti, and so on. In some embodiments, the first source electrode SE1 and/or the first drain electrode DE1 and the second source electrode SE2 and/or the second drain electrode DE2 may respectively have triple-layer structures including, e.g., Ti or Al. For example, each triple-layer structure may be formed by consecutively stacking Ti, Al, and Ti.

A planarization layer 118 may be arranged on the first source electrode SE1 and/or the first drain electrode DE1, the second source electrode SE2 and/or the second drain electrode DE2. The planarization layer 118 may include organic materials, e.g., acryl, BCB, PI, or HMDSO. In an embodiment, the planarization layer 118 may include inorganic materials. The planarization layer 118 may function as a protection layer covering the first and second thin film transistors T1 and T2, and may have an upper surface that is smoothened. In some embodiment, the planarization layer 118 may have a single-layer structure or a multi-layer structure.

An organic light-emitting device OLED may include a pixel electrode 310, an opposite electrode 330, and an intermediate layer 320 that includes an emission layer and is between the pixel electrode 310 and an opposite electrode 330. For example, the pixel electrode 310 of the organic light-emitting device OLED may be arranged on the planarization layer 118.

The pixel electrode 310 may be connected to the first drain electrode DE1 through a contact hole defined in the planarization layer 118, and may be connected to the first drain area D1 of the first thin film transistor T1 via the first drain electrode DE1. The pixel electrode 310 may directly be connected to the first thin film transistor T1, or may be indirectly connected to the first thin film transistor T1 via another thin film transistor (not shown) for controlling light-emission of the organic light-emitting device OLED.

The pixel electrode 310 may be a reflecting electrode including a reflection layer. The reflection layer may include at least one of, e.g., silver (Ag), magnesium (Mg), aluminum (Al), platinum (Pt), palladium (Pd), gold (Au), nickel (Ni), neodymium (Nd), iridium (Ir), and chrome (Cr). In some embodiments, the pixel electrode 310 may include a transparent electrode or a semi-transparent electrode on the reflection layer. the transparent electrode or the semi-transparent electrode may include at least one of, e.g., indium tin oxide (ITO), indium zinc oxide (IZO), zinc oxide (ZnO), indium oxide ($In_2O_3$), indium gallium oxide (IGO), and aluminum zinc oxide (AZO).

In an embodiment, the pixel electrode 310 may have a triple-layer structure including, e.g., ITO or Ag. For example, the triple-layer structure may be formed by consecutively stacking ITO, Ag, and ITO.

A pixel defining layer 120 may be arranged on the planarization layer 118. The pixel defining layer 120 may define pixels by forming an opening corresponding to each sub pixel, e.g., an opening exposing at least a center area of the pixel electrode 310. The pixel defining layer 120 may prevent electric arcs and the like at edges of the pixel electrode 310, by increasing distances between the edges of the pixel electrode 310 and the opposite electrode 330 above the pixel electrode 310. The pixel defining layer 120 may include an organic material, e.g., PI or HMDSO, and so on.

The intermediate layer 320 of the organic light-emitting device OLED may include, e.g., a low molecular weight material or a high molecular weight material. When the intermediate layer 320 includes the low molecular weight material, the intermediate layer 320 may have a hole injection layer (HIL), a hole transport layer (HTL), an emission layer (EML), an electron transport layer (ETL), and an electron injection layer (EIL), or the like, and may have a single-layer structure or a multi-layer structure. The low molecular weight material may include various organic materials, e.g., copper phthalocyanine (CuPc), N,N'-Di (Naphthalene-1-yl)-N,N'-diphenyl-benzidine (NPB), tris-8-hydroxyquinoline aluminum (Alq3), and so on. The various organic materials may be formed by a vacuum deposition method.

When the intermediate layer 320 includes the high molecular weight material, the intermediate layer 320 may have a structure including, e.g., an HTL and an EML. For example, the HTL may include, e.g., Poly(3,4-ethylenedioxythiophene (PEDOT), and the emission layer may include a polymer materials like poly-phenylenevinylene (PPV) and polyfluorene, and so on. The intermediate layer 320 may be formed by, e.g., a screen printing method, an inkjet printing method, a laser induced thermal imaging (LITI) method, and so on.

In some embodiments, the intermediate layer 320 may have many different structures. For example, the intermediate layer 320 may include a one-body layer corresponding to a plurality of pixel electrodes. For example, the intermediate layer 320 may have pattern layers corresponding to each of the plurality of pixel electrodes.

The opposite electrode 330 of the organic light-emitting device OLED may be formed in a one-body type with respect to a plurality of organic light-emitting devices to correspond to the plurality of pixel electrodes 310. The opposite electrode 330 may be a transparent electrode or a semi-transparent electrode. For example, the opposite electrode 330 may include at least one of, e.g., Al, Mg, Li, Ca, Cu, LiF/Ca, LiF/Al, MgAg, and CaAg, and may be formed as a thin film having a thickness of, e.g., about a few nm to about dozens of nm.

As the organic light-emitting device OLED may be easily damaged due to moisture or oxygen permeating from outside, a thin film encapsulation layer (not shown) may encapsulate the organic light-emitting device OLED for protection. The thin film encapsulation layer (not shown) may cover the display area DA, and may extend to an outer circumference of the display area DA. The thin film encapsulation layer may include an inorganic encapsulation layer including at least one inorganic material and an organic layer including at least one organic material. In some embodiments, the thin film encapsulation layer may have a stack structure of a first inorganic encapsulation layer, an organic encapsulation layer, and a second inorganic encapsulation layer.

For example, a spacer for protecting a mask from being chipped may be formed on the pixel defining layer 120, and various functional layers, e.g., a polarizing layer for decreasing reflection of external light, a black matrix, a color filter, and/or a touch screen including a touch electrode, and the like, may be provided on the thin film encapsulation layer.

FIGS. 3 through 11 illustrate respectively cross-sectional views of manufacturing steps of the display apparatus of FIG. 2. Steps shown in FIGS. 3 through 11 may be performed on the substrate 110 arranged on a carrier substrate (not shown), and the carrier substrate may be removed after performing the step shown in FIG. 11.

Figure 3:
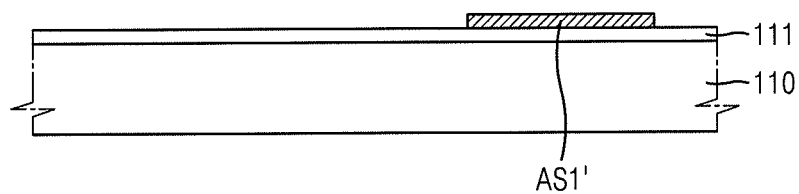
FIGS. 3 through 11 illustrate respectively cross-sectional views of manufacturing steps of the display apparatus.

Referring to FIG. 3, the buffer layer 111 and a polycrystalline silicon layer AS1' are formed on the substrate 110. The buffer layer 111 may include inorganic materials, e.g., silicon oxide, silicon nitride and/or silicon oxynitride, and the like, and may have a single-layer structure or a multi-layer structure.

The polycrystalline silicon layer AS1' may be formed through forming amorphous silicon on the entire surface of the substrate 110, forming polycrystalline silicon by annealing the amorphous silicon, and patterning the polycrystalline silicon with a first mask (not shown). In an embodiment, the polycrystalline silicon layer AS1' may be formed through forming the polycrystalline silicon directly on the entire surface of the substrate 110 and patterning the polycrystalline silicon.

Figure 4:
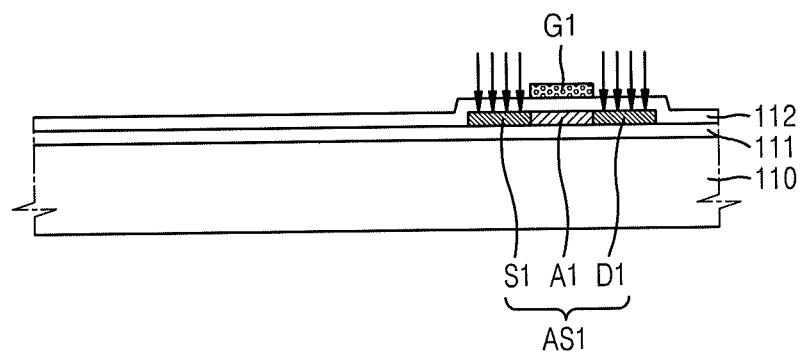

Referring to FIG. 4, the first gate insulating layer 112 may be formed on the buffer layer 111 to cover the polycrystalline silicon layer AS1', and then the first gate electrode G1 may be formed on the first gate insulating layer 112.

The first gate electrode G1 may be formed by coating a conductive material on the first gate insulating layer 112 and patterning the conductive material with a second mask (not shown). For example, the conductive material may include, e.g., Mo, Cu, and/or Ti.

After formation of the first gate electrode G1, a first source area S1 and a first drain area D1 may be formed by doping with impurities such that the first source area S1 and the first drain area D1 may have conductivity. For example, the first source area S1 and the first drain area D1 may be formed by doping the polycrystalline silicon layer AS1' with impurities using the first gate electrode G1 as a blocking member. In other words, in this step, the polycrystalline silicon layer AS1' may be changed into the first semiconductor layer AS1 including the first source area S1, the first drain area D1, and the first channel area A1 not doped with impurities.

Figure 5:
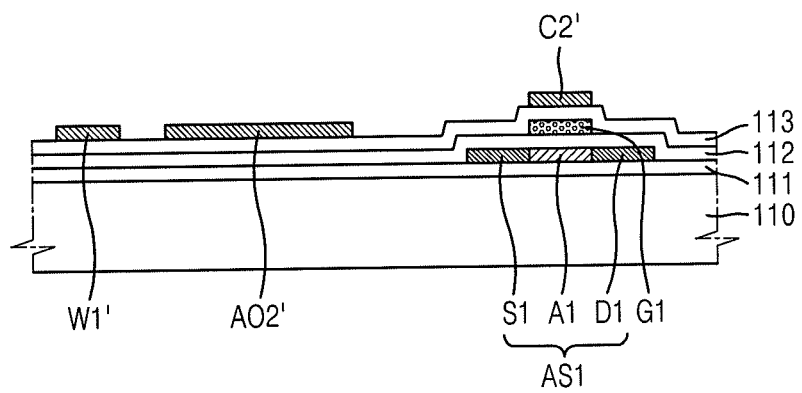

Referring to FIG. 5, after forming the second gate insulating layer 113 on the first gate insulating layer 112 to cover the first gate electrode G1, a pre-second semiconductor layer AO2' including an oxide semiconductor, a pre-upper electrode C2', and a pre-first wire W1' may be formed on the second gate insulating layer 113.

According to an embodiment, the pre-second semiconductor layer AO2', the pre-upper electrode C2', and the pre-first wire W1' may be formed by applying (or depositing) the oxide semiconductor on the second gate insulating layer 113 and patterning the oxide semiconductor with a third mask (not shown).

The oxide semiconductor layer may include, e.g., a ZnO-based material, e.g., ZnO, In—ZnO, Ga—In—ZnO, and so on. In some embodiment, the oxide semiconductor may be an In—Ga—ZnO (IGZO) semiconductor including metals, e.g., In and Ga in ZnO.

Figure 6:
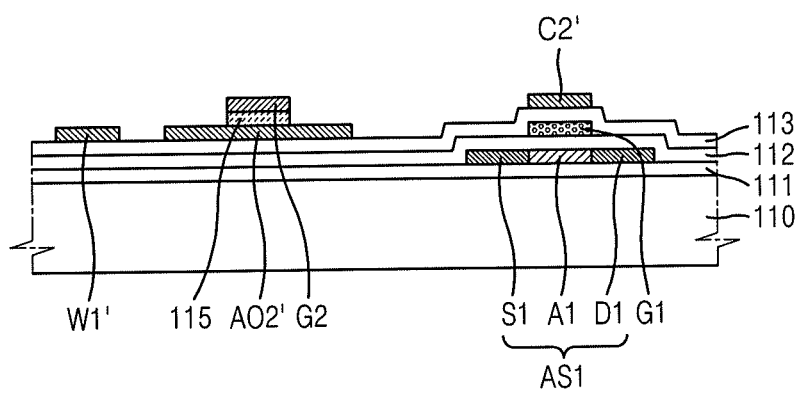

Referring to FIG. 6, the third gate insulating layer 115 and the second gate electrode G2 may be formed on the pre-second semiconductor layer AO2'. The third gate insulating layer 115 and the second gate electrode G2 may be formed by consecutively applying (or depositing) an insulating material and a conductive material on the second gate insulating layer 113 and simultaneously patterning the insulating and conductive materials with a fourth mask (not shown). As the third gate insulating layer 115 and the second gate electrode G2 are simultaneously formed with the same mask, the third gate insulating layer 115 and the second gate electrode G2 may have the substantially same width.

Figure 7:
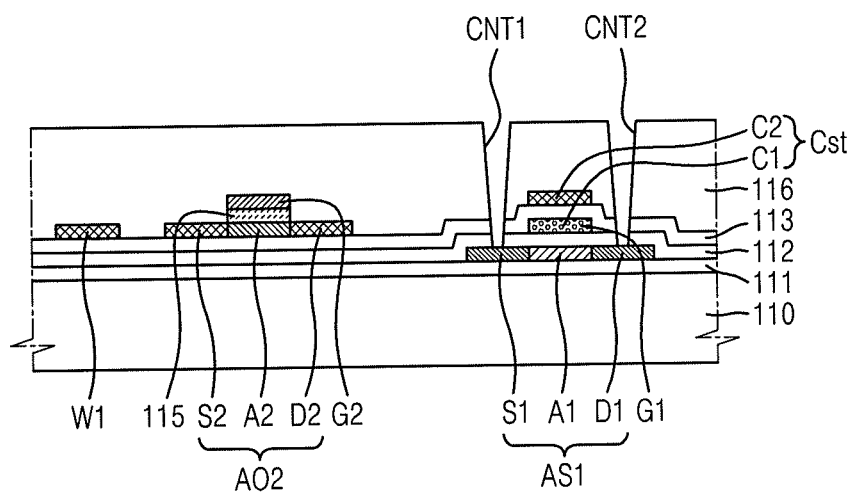

Referring to FIG. 7, the second source area S2, the second drain area D2, the upper electrode C2, and the first wire W1 are formed by a conductivizing process, e.g., by increasing carrier concentration of a part of the pre-second semiconductor layer AO2', the pre-upper electrode C2', and the pre-first wire W1'. For example, as the second gate electrode G2 may be used as a blocking member, the second channel area A2 of the second semiconductor layer AO2 may not be conductivized, and may maintain a characteristic of a semiconductor.

In some embodiments, the conductivizing process may be performed using a plasma treatment. The plasma treatment may be performed by using, e.g., hydrogen-based gases, fluorine-based gases, or combinations thereof.

In the conductivizing process, a hydrogen gas may permeate in a direction of a thickness of the oxide semiconductor and increase a concentration of a carrier such that a surface resistance of the oxide semiconductor may decrease. For example, the plasma treatment using the hydrogen gas may reduce an oxide metal in the oxide semiconductor by removing oxygen of the oxide metal such that the surface resistance of the oxide semiconductor may be reduced.

In some embodiment, when the plasma treatment is performed by using a fluorine-based gas, a fluorine component may increase and an oxygen component may decrease on the surface of the oxide semiconductor, and thus, an additional carrier may be formed on the surface of the oxide semiconductor. Accordingly, the carrier concentration of the oxide semiconductor may increase and the surface resistance of the oxide semiconductor may decrease. For example, the fluorine-based gas may be, e.g., $CF_4$, $C_4F_8$, $NF_3$, $SF_6$, or combinations thereof.

In another embodiment, the plasma treatment may be performed by a nitrogen gas. During the plasma treatment by using the nitrogen gas, an annealing process may be simultaneously performed. For example, the annealing process may be performed from about 1 hour to about 2 hours at a temperature from about 300° C. to about 400° C.

By the plasma treatment, the carrier concentration of the oxide semiconductor may be adjusted from a range of about 1.0 E+14 to about 1.0 E+18 $cm^{-3}$ to a value equal to or greater than 1.0 E+19 $cm^{-3}$.

Next, the first contact hole CNT1 and/or the second contact hole CNT2 may respectively expose the first source area S1 and/or the first drain area D1 of the first semiconductor layer AS1, and may be formed by forming the interlayer insulating layer 116 to cover the second semiconductor layer AO2, the upper electrode C2, and the first wire W1, and then by simultaneously removing (or penetrating) parts of the interlayer insulating layer 116, the second gate insulating layer 113, and the first gate insulating layer 112, with a fifth mask (not shown).

After forming the first contact hole CNT1 and/or the second contact hole CNT2, the annealing process may be performed. The annealing process may be a process for increasing carrier mobility of the first semiconductor layer AS1 by heating the first semiconductor layer AS1.

During the annealing process, an oxide layer may be formed on a surface of the first source area S1 exposed through the first contact hole CNT1 and/or the first drain area D1 exposed through the second contact hole CNT2. To remove the oxide layer, a washing process may be performed after the annealing process. For example, a buffered oxide etchant (BOE) may be used as a detergent for the washing process.

Figure 8:
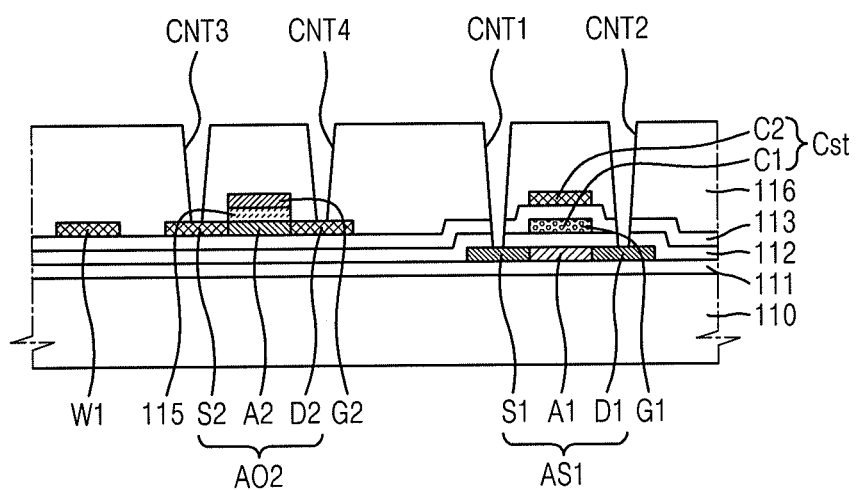

Although the BEO may etch an oxide semiconductor, the second semiconductor layer AO2 including the oxide semiconductor may be protected from the BEO by the interlayer insulating layer 116 when the first contact hole CNT1 and/or the second contact hole CNT2 are formed, Referring to FIG. 8, by etching the interlayer insulating layer 116 with a sixth mask (not shown) process, the third contact hole CNT3 and/or the fourth contact hole CNT4 may respectively expose the second source area S2 and/or the second drain area D2 of the second semiconductor layer AO2.

Figure 9:
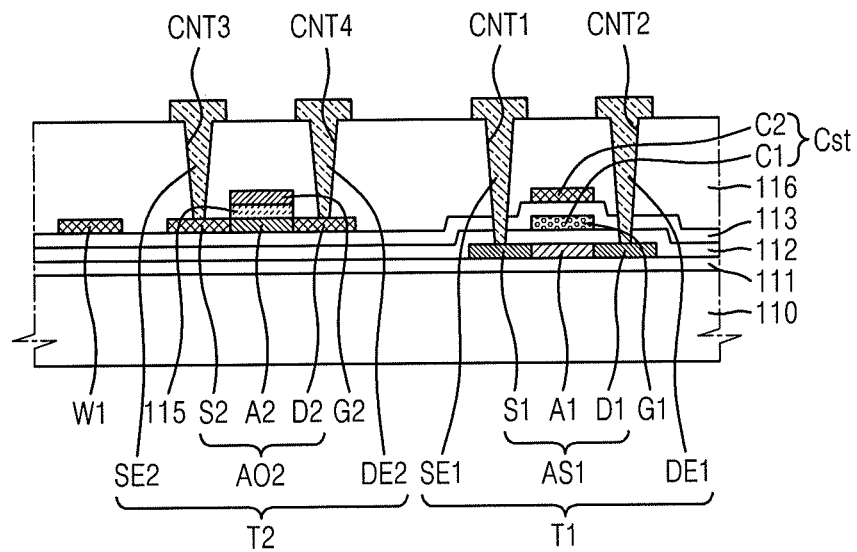

Referring to FIG. 9, the first source electrode SE1, the first drain electrode DE1, the second source electrode SE2, and the second drain electrode DE2 may be formed on the interlayer insulating layer 116. The first source electrode SE1, the first drain electrode DE1, the second source electrode SE2, and the second drain electrode DE2 may be simultaneously formed by patterning the conductive material with a seventh mask (not shown) after forming the conductive material on the interlayer insulating layer 116. In other words, the first source electrode SE1, the first drain electrode DE1, the second source electrode SE2, and the second drain electrode DE2 may be arranged on one same layer, and may include same materials. For example, each of the first source electrode SE1, the first drain electrode DE1, the second source electrode SE2, and the second drain electrode DE2 may have a triple-layer structure including, e.g., Ti or Al. For example, the triple-layer structure may be formed by consecutively stacking Ti, Al, and Ti.

The first source electrode SE1 may fill the first contact hole CNT1 and contact the first source area S1 of the first semiconductor layer AS1 through the first contact hole CNT1. The first drain electrode DE1 may fill the second contact hole CNT2, and may contact the first drain area D1 of the first semiconductor layer AS1 through the second contact hole CNT2.

The second source electrode SE2 may fill the third contact hole CNT3, and may contact the second source area S2 of the second semiconductor layer AO2 through the third contact hole CNT3. The second drain electrode DE2 may fill the fourth contact hole CNT4, and may contact the second drain area D2 of the second semiconductor layer AO2 through the fourth contact hole CNT4.

Figure 10:
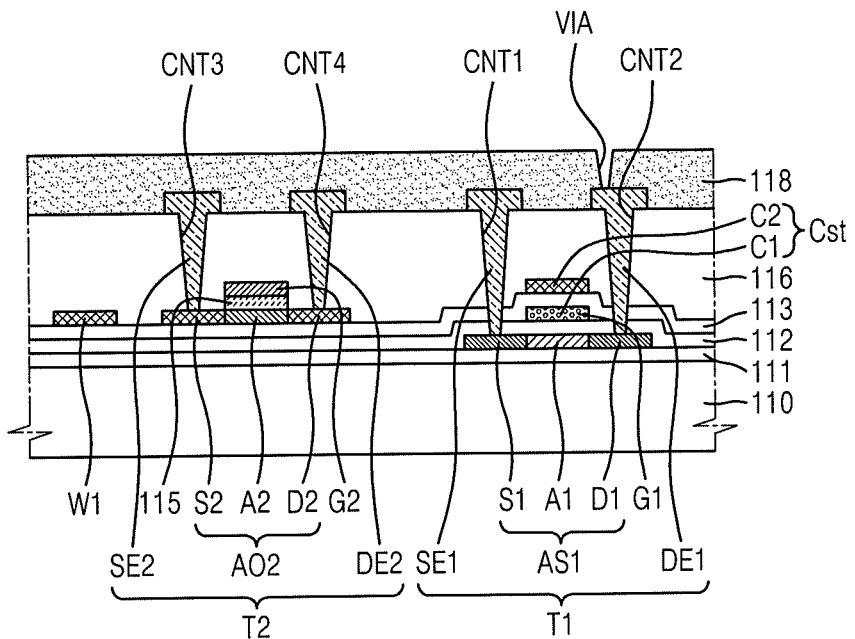

Referring to FIG. 10, the planarization layer 118 may formed on the interlayer insulating layer 116 to cover the first source electrode SE1, the first drain electrode DE1, the second source electrode SE2, and the second drain electrode DE2. The planarization layer 118 may include a via hole VIA exposing the first drain electrode DE1. The planarization layer 118 may be formed by forming an organic material to cover the first source electrode SE1, the first drain electrode DE1, the second source electrode SE2, and the second drain electrode DE2, and patterning the via hole VIA with an eighth mask (not shown). For example, the organic material may include, e.g., acryl, benzocyclobutene (BCB), PI, or HMDSO, and the like.

Figure 11:
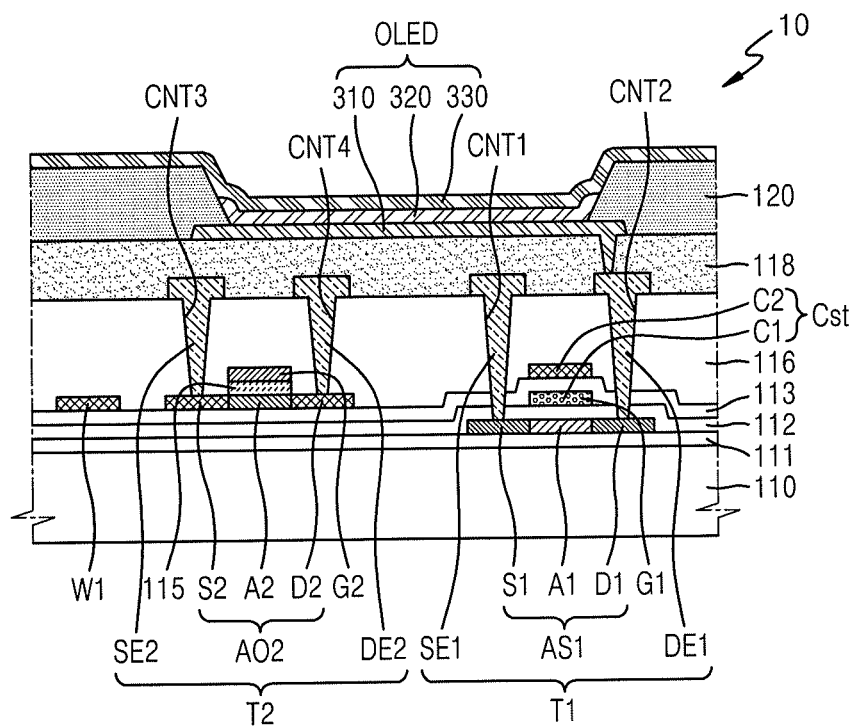

Referring to FIG. 11, after forming a pixel electrode 310 on the planarization layer 118 with a ninth mask (not shown), a pixel defining layer 120 may be formed on the planarization layer 118 and the pixel electrode 310 with a tenth mask (not shown). For example, the pixel defining layer 120 may have an opening exposing a part of the pixel electrode 310.

The pixel electrode 310 may fill the via hole VIA, and may contact the first drain electrode DE1 through the via hole VIA. In some embodiment, a connection area of the pixel electrode 310, in which the first drain electrode DE1 and the pixel electrode 310 are connected to each other, may not be on the first thin film transistor T1. For example, the first thin film transistor T1 and the pixel electrode 310 may be connected to each other via another thin film transistor, and the connection area of the pixel electrode 310 may be arranged on the another thin film transistor.

Next, an organic light-emitting device OLED may be formed by forming the intermediate layer 320 including an organic emission layer on the pixel electrode 310 and forming the opposite electrode 330 on the intermediate layer 320.

Figure 12:
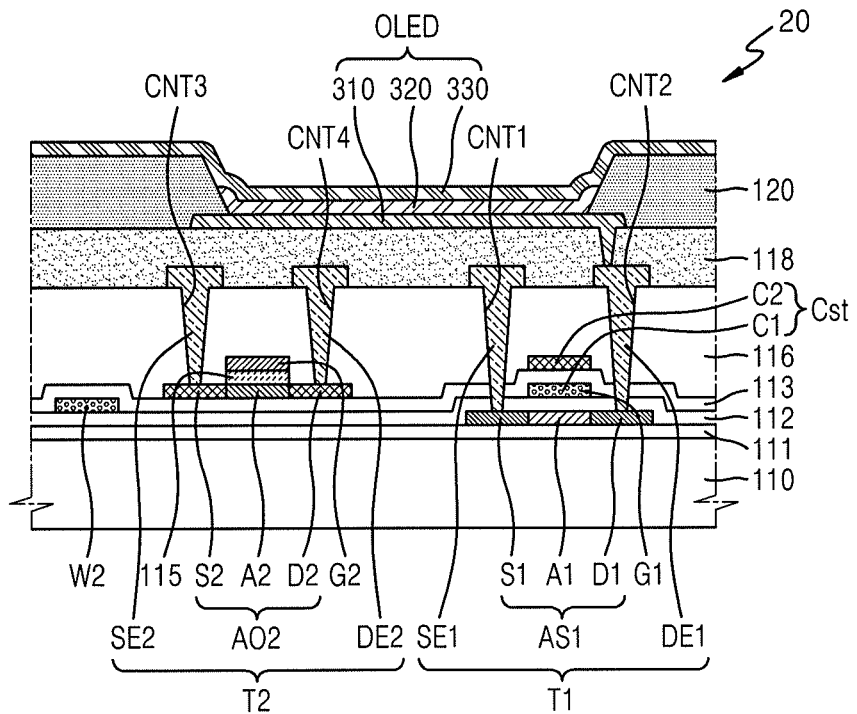
FIG. 12 illustrates a cross-sectional view of a part of a display apparatus according to another embodiment.

FIG. 12 illustrates a cross-sectional view of a part of a display apparatus 20 according to another embodiment.

Referring to FIG. 12, the display apparatus 20 may include the first thin film transistor T1 including the silicon semiconductor, the second thin film transistor T2 including the oxide semiconductor, and the storage capacitor Cst at least partially overlapping the first thin film transistor T1. The upper electrode C2 of the storage capacitor Cst and the second semiconductor layer AO2 of the second thin film transistor T2 may include the same material, and may be formed on the same layer.

The storage capacitor Cst may include the lower electrode C1, the upper electrode C2, and the second gate insulating layer 113 between the lower electrode C1 and the upper electrode C2. The lower electrode C1 of the storage capacitor Cst and the first gate electrode G1 of the first thin film transistor T1 may be formed in one same body. For example, the first gate electrode G1 may function not only as a gate electrode of the first thin film transistor T1 but also as the lower electrode C1 of the storage capacitor Cst.

In the embodiment, the display apparatus 20 may include a second wire W2. The second wire W2 and the first gate electrode G1 of the first thin film transistor T1 may be formed on the same layer, and may be formed of the same material. For example, the second wire W2 may be arranged on the first gate insulating layer 112, and may include, e.g., Mo, Cu, and/or Ti. The second wire W2 may supply signals, e.g., an initialization voltage, to the first thin film transistor T1 via the second thin film transistor T2 or another thin film transistor (not shown).

Figure 13:
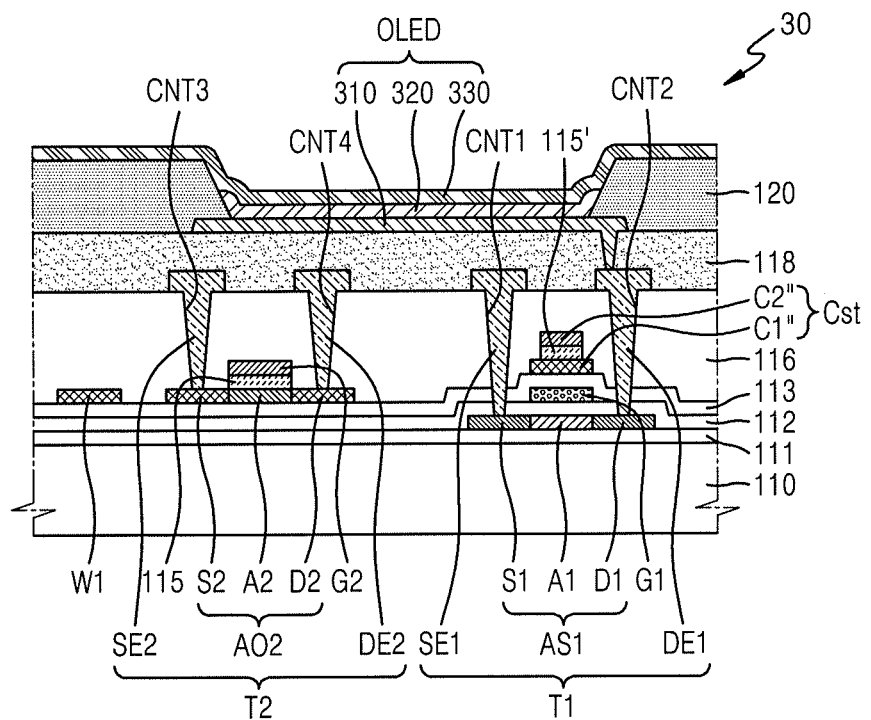
FIG. 13 illustrates a cross-sectional view of a part of a display apparatus according to another embodiment.

FIG. 13 illustrates a cross-sectional view of a part of a display apparatus 30 according to another embodiment.

Referring to FIG. 13, the display apparatus 30 may include the first thin film transistor T1 including the silicon semiconductor, the second thin film transistor T2 including the oxide semiconductor, and the storage capacitor Cst at least partially overlapping the first thin film transistor T1. In FIG. 13, a lower electrode C1" of the storage capacitor Cst and the second semiconductor layer AO2 of the second thin film transistor T2 may be formed of the same material, and may be formed on the same layer.

The storage capacitor Cst may include the lower electrode C1" and an upper electrode C2", and a dielectric layer 115' between the lower electrode C1" and the upper electrode C2". The lower electrode C1" and the second semiconductor layer AO2 of the second thin film transistor T2 may be simultaneously formed. For example, the lower electrode C1" may include an oxide semiconductor material, and may be conductivized by increasing carrier concentration through a plasma treatment and the like. For example, the lower electrode C1" may include a ZnO-based material including, e.g., ZnO, In—ZnO, Ga—In—ZnO, and may be formed by increasing the carrier concentration of the oxide semiconductor layer through the plasma treatment by using, e.g., hydrogen-based gases, fluorine-based gases, or combinations thereof.

The upper electrode C2" and the second gate electrode G2 of the second thin film transistor T2 may be formed of the same material, and may be formed on the same layer. The dielectric layer 115" and the third gate insulating layer 115 may be formed of the same material, and may have different levels from the substrate 110. As the upper electrode C2" and the dielectric layer 115" may be formed in the same mask process, widths of the upper electrode C2" and the dielectric layer 115" may substantially be identical to each other.

In the embodiment, as the lower electrode C1" of the storage capacitor Cst and the second semiconductor layer AO2 of the second thin film transistor T2 may be formed in the same process, process time and process cost for the display apparatus 30 may be reduced.

Figure 14:
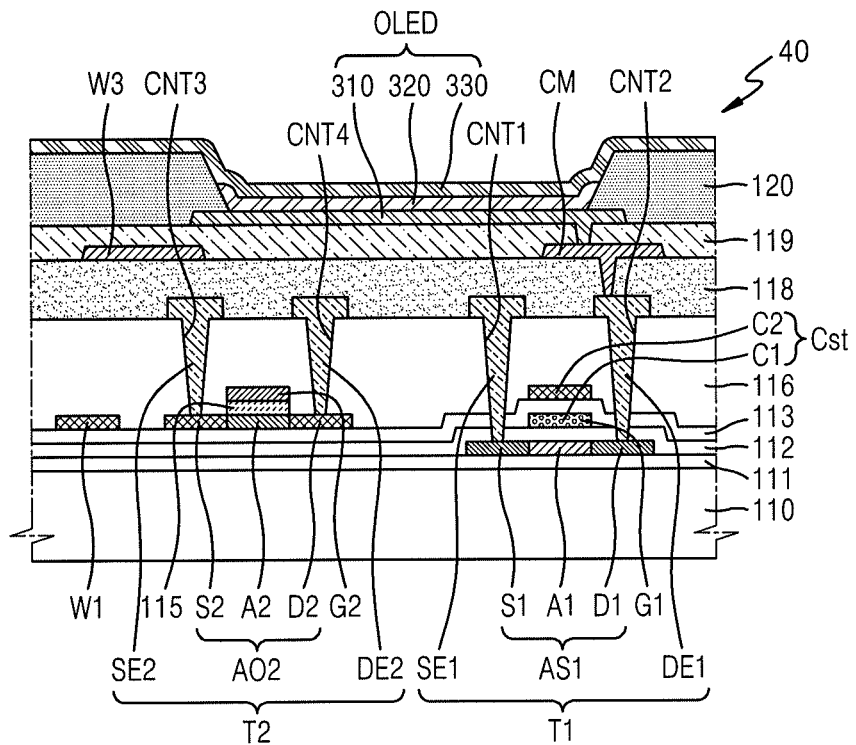
FIG. 14 illustrates a cross-sectional view of a part of a display apparatus according to another embodiment.

FIG. 14 illustrates a cross-sectional view of a part of a display apparatus 40 according to another embodiment.

Referring to FIG. 14, the display apparatus 40 may include the first thin film transistor T1 including the silicon semiconductor, the second thin film transistor T2 including the oxide semiconductor, and the storage capacitor Cst at least partially overlapping the first thin film transistor T1. The upper electrode C2 of the storage capacitor Cst and the second semiconductor layer AO2 of the second thin film transistor T2 may include the same material, and may be formed on the same layer.

The storage capacitor Cst may include the lower electrode C1 and the upper electrode C2, and the second gate insulating layer 113 between the lower electrode C1 and the upper electrode C2. The lower electrode C1 and the first gate electrode G1 may be formed in one same body. For example, the first gate electrode G1 may function not only as the gate electrode G1 of the first thin film transistor T1 but also as the lower electrode C1 of the storage capacitor Cst.

In the embodiment, the display apparatus 40 may include a connection electrode CM and/or a third wire W3 on the planarization layer 118, and may include an upper planarization layer 119 covering the connection electrode CM and/or the third wire W3.

The third wire W3 may function as a driving voltage line for supplying a driving voltage or a data line for supplying a data signal. The connection electrode CM may be connected to the first drain electrode DE1 through a contact hole defined in the planarization layer 118. The third wire W3 and the connection electrode CM may include, e.g., metals and conductive materials. For example, each of the third wire W3 and the connection electrode CM may include, e.g., Al, Cu, and Ti, and may have a single-layer structure or a multi-layer structure. By including the third wire W3, data signals or driving voltages may be supplied through various routes, and interruptions between the wires may be minimized.

The upper planarization layer 119 may cover the third wire W3 and the connection electrode CM. The upper planarization layer 119 may include organic materials, e.g., acryl, BCB, PI, or HMDSO. An upper surface of the upper planarization layer 119 may be smoothened. The upper planarization layer 119 may have a single-layer structure or a multi-layer structure. The organic light-emitting device OLED may include the pixel electrode 310, the opposite electrode 330, and the intermediate layer 320 that includes the emission layer and is between the pixel electrode 310 and the opposite electrode 330. The organic light-emitting device OLED may be placed on the upper planarization layer 119. The pixel electrode 310 may contact the connection electrode CM through a via hole in the upper planarization layer 119.

According to the embodiment, an eleventh mask process for patterning the connection electrode CM and the third wire W3 and a twelfth mask process for patterning the upper planarization layer 119 including the via hole may be performed.

Figure 15:
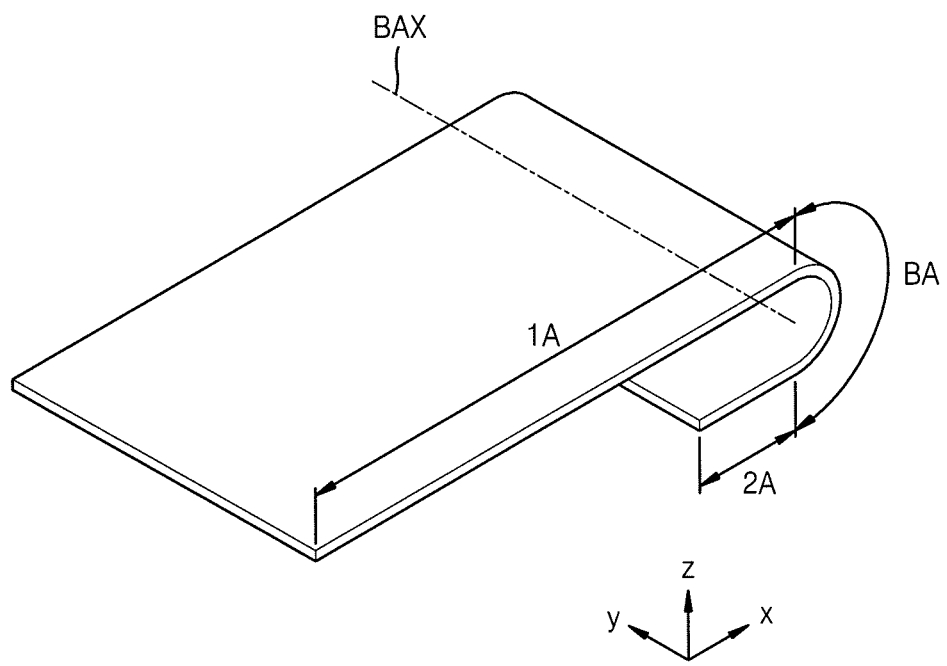
FIG. 15 illustrates a perspective view of a part of a display apparatus according to another embodiment.

FIG. 15 illustrates a perspective view of a part of a display apparatus according to an embodiment. In the display apparatus according to embodiments, a part of the substrate 110 included in the display apparatus may be bent, and a part of the display apparatus may be bent like the substrate 110. However, for convenience of illustration, FIGS. 16 and 17 illustrate the display apparatus in an unbent state (i.e., in a flat state).

As shown in FIG. 15, the substrate 110 included in the display apparatus according to the embodiment may have a bending area BA extending in a first direction (i.e., y-direction). With respect to a second direction (i.e., x-direction) crossing the first direction, the bending area BA may be between a first area 1A and a second area 2A. For example, the substrate 110 may be bent with respect to a bending axis BAX extending in the first direction (i.e., y-direction), as shown in FIG. 1. For example, as illustrated in FIG. 15, the substrate 110 may be bent with a regular radius of curvature with respect to the bending axis BAX at a center of the curvature. In another embodiment, the substrate 110 may be bent in an irregular radius of curvature with respect to the bending axis BAX at a center of the curvature.

Figure 16:
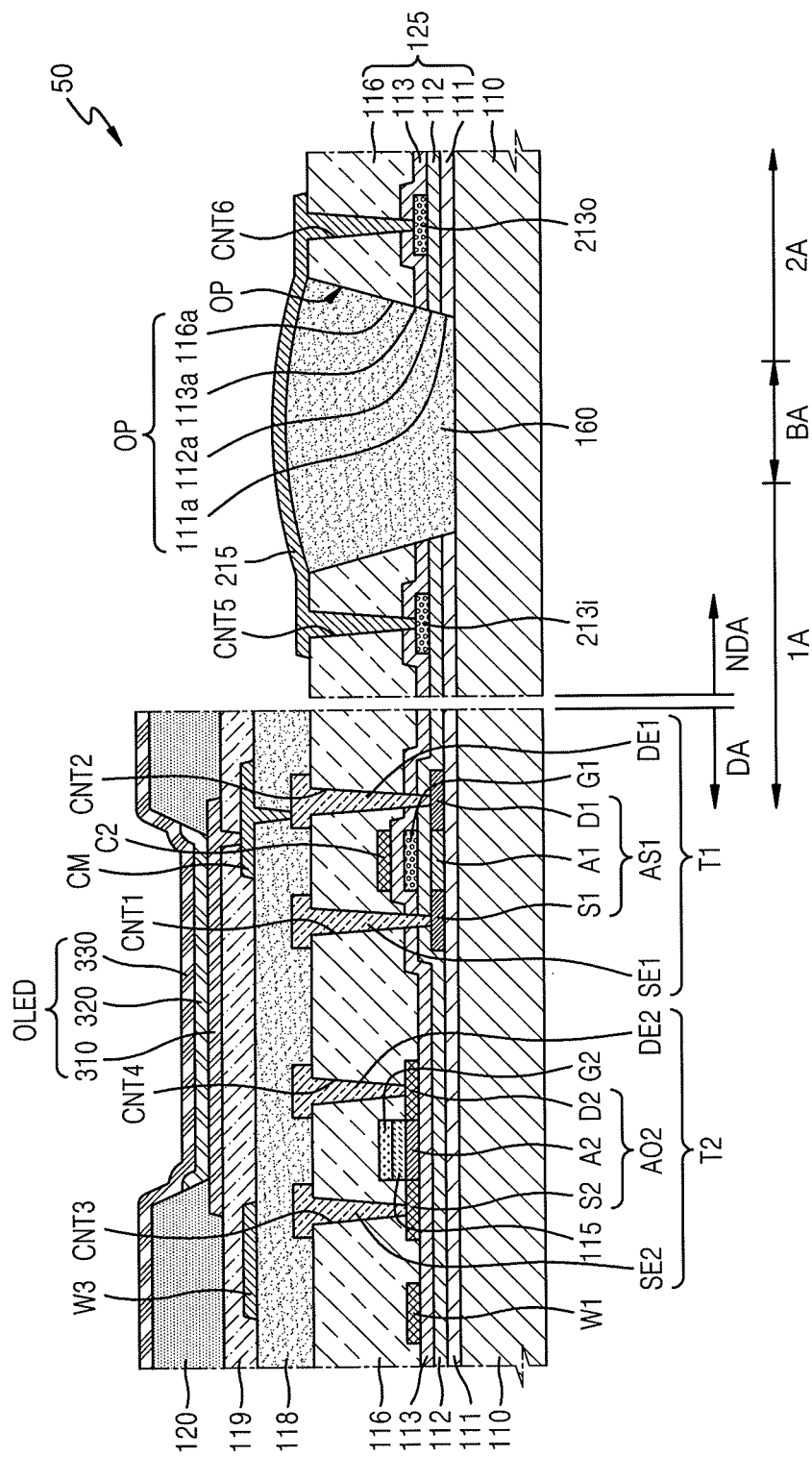
FIG. 16 illustrates a cross-sectional view of a part of a display apparatus according to another embodiment.
Figure 17:
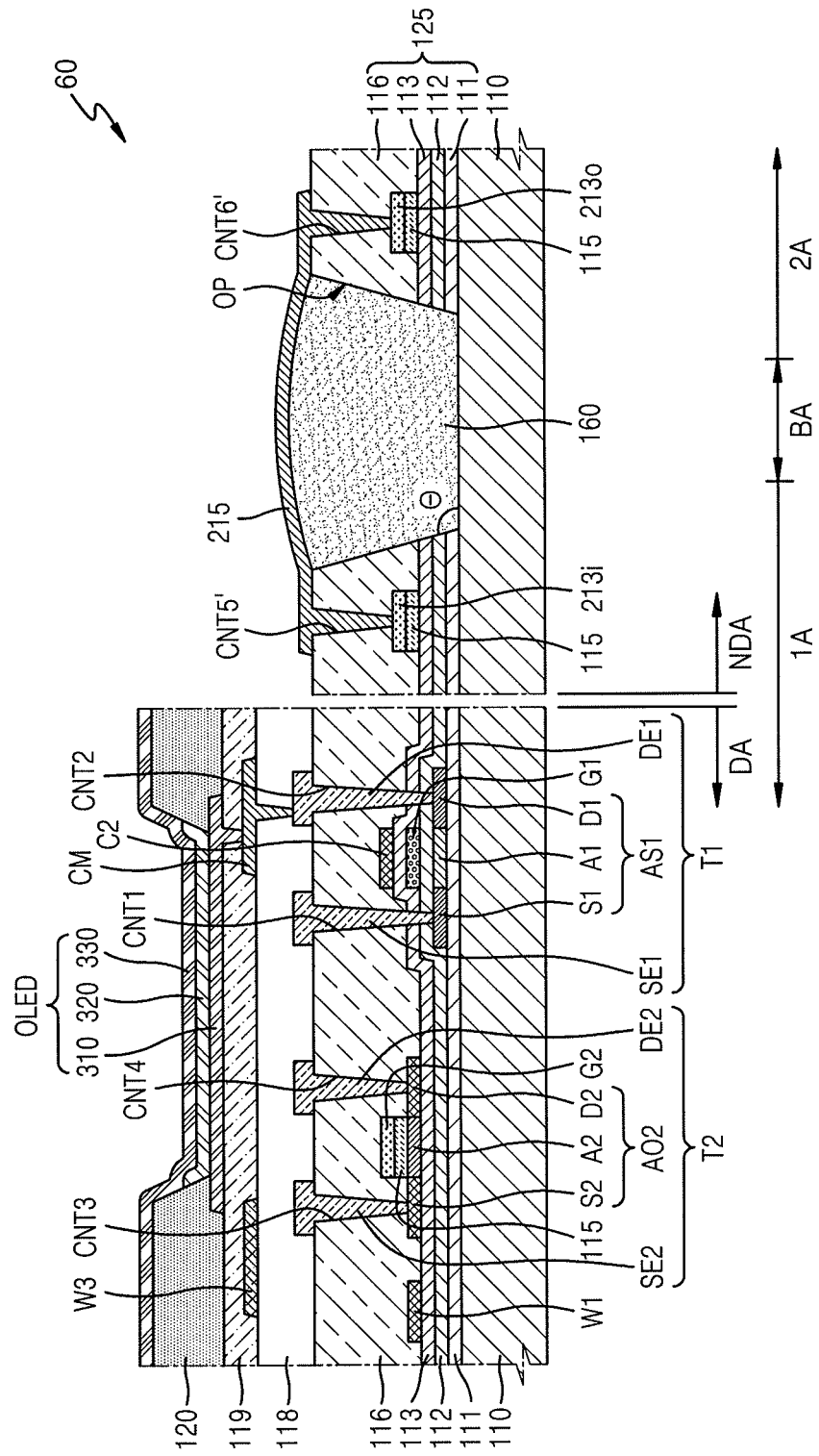
FIG. 17 illustrates a cross-sectional view of a part of a display apparatus according to another embodiment.

FIG. 16 illustrates a display apparatus including a bending area according to embodiments. For example, as illustrated in FIG. 16, the display area DA of a display apparatus 50 may have the same structure as the display apparatus 40 in FIG. 14. In other embodiments, the display area DA may have the same structure as those of the display apparatus 10, 20, and 30 described above.

A first area 1A may include the display area DA and a part of a non-display area NDA outside the display area DA. A second area 2A may include another part of the non-display area NDA.

A bending area BA may be arranged between the first area 1A and the second area 2A. An organic material layer 160 may be arranged in the bending area BA. An inorganic insulating layer 125 including, e.g., the buffer layer 111, the first gate insulating layer 112, the second gate insulating layer 113, and the interlayer insulating layer 116, which respectively include inorganic materials, may not be arranged in the bending area BA. For example, as illustrated in FIG. 16, the inorganic insulating layer 125 may have an opening OP corresponding to the bending area BA. In other words, the buffer layer 111, the first gate insulating layer 112, the second gate insulating layer 113, and the interlayer insulating layer 116 may have openings corresponding to the bending area BA. The opening OP of the inorganic insulating layer 125 corresponding to the bending area BA may overlap the bending area BA. For example, a width of the opening OP of the inorganic insulating layer 125 may be wider than that of the bending area BA.

For example, as illustrated in FIG. 16, an inner side of an opening 111a of the buffer layer 111 may be identical to an inner side of an opening 112a of the first gate insulating layer 112. In other embodiments, a width of the opening 112a of the first gate insulating layer 112 may be greater than a width of the opening 111a of the buffer layer 111.

For example, the opening 112a of the first gate insulating layer 112, an opening 113a of the second gate insulating layer 113, an opening 116a of the interlayer insulating layer 116 may be simultaneously formed when the first contact hole CNT1 and the second contact hole CNT2 are formed. After simultaneously forming the opening 112a of the first gate insulating layer 112, an opening 113a of the second gate insulating layer 113, an opening 116a of the interlayer insulating layer 116, the first source electrode SE1 and the first drain electrode DE1 may be respectively formed in the first contact hole CNT1 and the second contact hole CNT2. The opening OP of the inorganic insulating layer 125 may be formed in an additional mask process for forming the opening 111a of the buffer layer 111 after forming the first source electrode SE1 and the first drain electrode DE1. Thus, in the embodiment, thirteen mask processes may be performed.

In some embodiments, to correspond to the bending area BA, a groove, instead of the opening OP, may be formed in the inorganic insulating layer 125. For example, the groove corresponding to the bending area BA may penetrate the first gate insulating layer 112, the second gate insulating layer 113, and the interlayer insulating layer 116, and may not penetrate the buffer layer 111. In another embodiment, the groove corresponding the bending area BA may not penetrate at least one of the first gate insulating layer 112, the second gate insulating layer 113, the interlayer insulating layer 116, and the buffer layer 111 such that the substrate 110 may not be exposed.

The display apparatus 50 may include the organic material layer 160 filling the opening OP or the groove of the inorganic insulating layer 125. For example, the organic material layer 160 may overlap the bending area BA. The organic material layer 160 may extend to a part of a non-bending area outside the bending area BA. For example, a width of the organic material layer 160 may be greater than a width of the bending area BA. Further, a lower surface, e.g., a surface facing the substrate 110, of the organic material layer 160 may be narrower than an upper surface of the organic material layer 160. In other words, sidewalls of the opening OP may form an obtuse angle θ with the upper surface of the substrate 110. The organic material layer 160 may have an irregular thickness. For example, the organic material layer 160 may have a greatest thickness in a middle portion thereof, and a smallest thickness at edges thereof. In an embodiment, the organic material layer 160 may have a uniform thickness.

The organic material layer 160 may include at least one of, e.g., acryl, methacryl, polyester, polyethylene, polypropylene, PET, PEN, PC, PI, polyethylene sulfonate, polyoxymethylene, polyarylate, and HMDSO. The organic material layer 160 and the planarization layer 118 of the display area DA may be simultaneously formed of the same material. In an embodiment, the organic material layer 160 and the planarization layer 118 of the display area DA may be formed of different materials at different times. The organic material layer 160 may be variously modified. For example, the organic material layer 160 and the upper planarization layer 119 or the pixel defining layer 120 may be simultaneously formed of the same material.

The display apparatus 50 may include a connection wire 215. The connection wire 215 may extend from the first area 1A to the second area 2A via the bending area BA, and may be placed on the organic material layer 160. For example, the connection wire 215 may be provided on the inorganic insulating layer 125 including the interlayer insulating layer 116 in an area in which the organic material layer 160 is not arranged. The connection wire 215 may function as a wire for supplying electrical signals to the display area DA. The connection wire 215 and the connection electrode CM may be formed at the same time, and may be formed of the same material.

As described above, although FIG. 16 illustrates the display apparatus in the unbent state (i.e., in a flat state), the display apparatus according to the embodiment may be in a state in which the substrate 110, or the like, is bent in the bending area BA, as shown in FIG. 15. In other words, when the display apparatus is manufactured, the substrate 110 may have a substantially flat state, as shown in FIG. 16, and then, the substrate 110, and so on, may be bent in the bending area BA such that the display apparatus may have the substantially same form as shown in FIG. 15. Although tension stress may be applied to the connection wire 215 when the substrate 110, and the like, is bent in the bending area BA, defects of the connection wire 215 on the organic material layer 160 in the bending state may be prevented or minimized due to flexibility of the organic material layer 160.

When the inorganic insulating layer 125 does not include the opening OP or the groove in the bending area and has a continuous form from the first area 1A to the second area 2A (i.e., when the connection wire 215 is placed on the inorganic insulating layer 125), great tension stress may be applied to the connection wire 215 by the bending operation of the substrate 100, and the like. For example, as the inorganic insulating layer 125 has a rigidity higher than that of the organic material layer 160, probability of cracks of the inorganic insulating layer 125 is high in the bending area BA. When the cracks occur in the inorganic insulating layer 125, the cracks of the inorganic insulating layer 125 may damage the connection wire 215 on the inorganic insulating layer 125, and thus, probability of defects of the connection wire 215, e.g., disconnection, may be increased.

However, as described above, when the inorganic insulating layer 125 may include the opening OP in the bending area BA, and the connection wire 215 may be placed on the organic material layer 160 filling the opening OP, the probability of cracks of the inorganic insulating layer 125 may be significantly decreased, because the inorganic insulating layer 125 having a high probability of cracks may not be in the bending area BA. Further, probability of cracks of the organic material layer 160, which includes an organic material, may not be high due to a low rigidity thereof. Thus, cracks, and the like, being formed in the connection wire 215 on the organic material layer 160 may be prevented or minimized.

The display apparatus 50 according to the embodiment may further include an inner wire 213$i$ and an outer wire 213$o$ connected to the connection wire 215. The inner wire 213$i$ and the outer wire 213$o$ are placed in the first area 1A or the second area 2A on a layer other than that of the connection wire 215, and may be electrically connected to the connection wire 215. For example, the inner wire 213$i$ and the outer wire 213$o$ may be formed on the first gate insulating layer 112.

Referring to FIG. 16, the inner wire 213$i$ may be placed in the first area 1A, and the outer wire 213$o$ may be placed in the second area 2A. The inner wire 213$i$ and the outer wire 213$o$ may be formed of the same material. The inner wire 213$i$, the outer wire 213$o$, and the first gate electrode G1 may be formed on the same layer. For example, the inner wire 213$i$, the outer wire 213$o$, and the first gate electrode G1 may be formed on the first gate insulating layer 112.

The connection wire 215 may be connected to the inner wire 213$i$ and the outer wire 213$o$ through a fifth contact hole CNT5 and a sixth contact hole CNT6 penetrating the interlayer insulating layer 116 and the second gate insulating layer 113.

The inner wire 213$i$ in the first area 1A may be electrically connected to the first thin film transistor T1, the second thin film transistor T2, and the like in the display area DA. For example, the connection wire 215 may be electrically connected to the first thin film transistor T1, the second thin film transistor T2, and/or the first wire W1, and the like in the display area DA through the inner wire 213$i$. The inner wire 213$i$ may be connected to conductive layers formed on a different layer in the display area DA, e.g., a conductive layer formed on the interlayer insulating layer 116 or a conductive layer formed on the second gate insulating layer 113 through contact holes.

By using the connection wire 215, the outer wire 213$o$ in the second area 2A may be electrically connected to the first thin film transistor T1, the second thin film transistor T2, and/or the first wire W1 in the display area DA. The outer wire 213$o$ may be connected to conductive layers formed on different layers in the second area 2A, e.g., the conductive layer placed on the interlayer insulating layer 116 or the conductive layer placed on the second gate insulating layer 113 through contact holes.

As described above, the inner wire 213$i$ and the outer wire 213$o$ may be electrically connected to elements in the display area DA while being placed outside the display area DA. For example, the inner wire 213$i$ and the outer wire 213$o$ may extend toward the display area DA, while being placed outside the display area DA, and may be at least partially placed in the display area DA.

Although the connection wire 215 may cross the bending area BA, cracks or disconnections of the connection wire 215 in the bending area BA may be prevented or minimized, because the connection wire 215 may have a material having a high elongation percentage. When the inner wire 213$i$ and the outer wire 213$o$ are used for supplying electric signals in the first area 1A and the second area 2A, efficiency of the display apparatus in supplying electrical signals may be increased or error rate in the manufacturing processes may be decreased, because the inner wire 213$i$ and the outer wire 213$o$ may have a material having a lower elongation percentage than that of the connection wire 215 and electrical/physical features different from those of the connection wire 215.

For example, the inner wire 213$i$ and the outer wire 213$o$ may include, e.g., Mo, and the connection wire 215 may include, e.g., Al. The connection wire 215, the inner wire 213$i$, and the outer wire 213$o$ may respectively have multilayer structures. Meanwhile, ends of the outer wire 213$o$ in the second area 2A may be exposed outwards, and may be electrically connected to various electronic devices or a printed circuit board.

The inorganic insulating layer 125, which is arranged between the connection wire 215 and the inner wire 213$i$ and between the connection wire 215 and the outer wire 213$o$, may be variously modified or transformed. For example, only the interlayer insulating layer 116 may be between the connection wire 215 and the inner wire 213$i$ and between the connection wire 215 and the outer wire 213$o$. In another embodiment, only the interlayer insulating layer 116 may be between the connection wire 215 and the inner wire 213$i$, and the interlayer insulating layer 116 and the second gate insulating layer 113 may be between the connection wire 215 and the outer wire 213$o$.

FIG. 17 illustrates a cross-sectional view of a part of a display apparatus 60 according to another embodiment.

Referring to FIG. 17, the display apparatus 60 may include the bending area BA between the first area 1A and the second area 2A. The first area 1A may include the first thin film transistor T1 including the silicon semiconductor, the second thin film transistor T2 including the oxide semiconductor, and the storage capacitor Cst overlapping the first thin film transistor T1. For example, the second semiconductor layer AO2 of the second thin film transistor T2 and one of the electrodes of the storage capacitor Cst may be arranged on the same layer, e.g., on the first gate insulating layer 112.

The inorganic insulating layer 125 may include an opening OP or a groove to correspond to the bending area BA. The organic material layer 160 may fill the opening OP or the groove. The connection wire 215 may be arranged on the organic material layer 160. The connection wire 215 may extend from the first area 1A to the second area 2A.

The connection wire 215 may be connected to the inner wire 213*i* and the outer wire 213*o* through a contact hole CNT5' and a contact hole CNT6' penetrating the interlayer insulating layer 116.

The inner wire 213*i* may be placed in the first area 1A. The outer wire 213*o* may be placed in the second area 2A. The inner wire 213*i*, the outer wire 213*o*, and the second gate electrode G2 may be formed of the same material, and may be on the same layer. For example, the inner wire 213*i*, the outer wire 213*o*, and the second gate electrode G2 may be placed on the third gate insulating layer 115. For example, as the inner wire 213*i* and the third gate insulating layer 115 may be formed with the same mask process, a width of the inner wire 213*i* may substantially be identical to a width of the third gate insulating layer 115 arranged below the inner wire 213*i*, and a width of the outer wire 213*o* may substantially be identical to the width of the third gate insulating layer 115 arranged below the outer wire 213*o*.

The inner wire 213*i* in the first area 1A may be electrically connected to the first thin film transistor T1, the second thin film transistor T2, and the like in the display area DA. The connection wire 215 may be electrically connected to the first thin film transistor T1, the second thin film transistor T2, and/or the first wire W1, and the like in the display area DA through the inner wire 213*i*. Through a contact hole, the inner wire 213*i* may be connected to conductive layers formed on a different layer in the display area DA, e.g., a conductive layer formed on the interlayer insulating layer 116 or a conductive layer formed on the second gate insulating layer 113.

By using the connection wire 215, the outer wire 213*o* in the second area 2A may be electrically connected to the first thin film transistor T1, the second thin film transistor T2, and/or the first wire W1 in the display area DA. Through a contact hole, the outer wire 213*o* may be connected to conductive layers formed on different layers in the second area 2A, e.g., the conductive layer placed on the interlayer insulating layer 116 or the conductive layer placed on the second gate insulating layer 113.

As described above, the inner wire 213*i* and the outer wire 213*o* may be electrically connected to elements in the display area DA while being placed outside the display area DA. For example, the inner wire 213*i* and the outer wire 213*o* may extend toward the display area DA, while being placed outside the display area DA, and may be at least partially placed in the display area DA.

As illustrated in FIG. 17, the inner wire 213*i*, the outer wire 213*o*, and the second gate electrode G2 may be formed of the same material, and may be on the same layer. In another embodiment, the inner wire 213*i* and the first gate electrode G1 may be formed of the same material, and may be on the same layer. The outer wire 213*o* and the second gate electrode G2 may be formed of the same material, and may be on the same layer. In other embodiments, the first gate electrode G1 and parts of the inner wire 213*i* and the outer wire 213*o* may be formed of the same material, and may be on the same layer. The second gate electrode G2 and other parts of the inner wire 213*i* and the outer wire 213*o* may be formed of the same material, and may be on the same layer.

Figure 18:
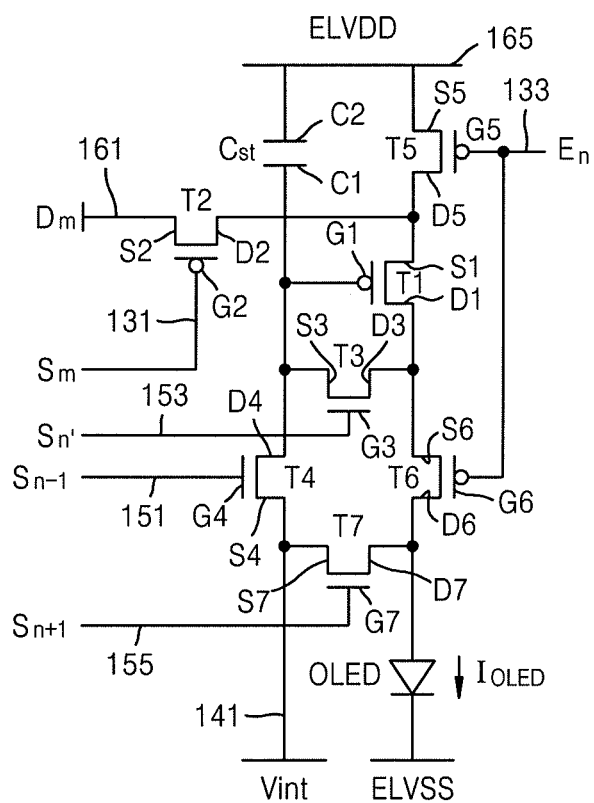
FIG. 18 illustrates a diagram of an equivalent circuit of a pixel included in the display apparatus according to an embodiment.

FIG. 18 illustrates a diagram of an equivalent circuit of a pixel included in the display apparatus according to an embodiment.

Referring to FIG. 18, a pixel PX may include signal lines 131, 133, 151, 153, 155 and 161, a plurality of thin film transistors T1, T2, T3, T4, T5, T6, and T7 connected to the signal lines 131, 133, 151, 153, 155 and 161, the storage capacitor Cst, an initialization voltage line 141, a driving voltage line 165, and the organic light-emitting device OLED.

As illustrated in FIG. 18, each pixel PX may include the signal lines 131, 133, 151, 153, 155, and 161, the initialization voltage line 141, and the driving voltage line 165. In another embodiment, at least one of the signal lines 131, 133, 151, 153, 155, and 161, the initialization voltage line 141, and/or the driving voltage line 165 may be shared with pixels adjacent to one another.

Each pixel PX may include a driving thin film transistor T1, a switching thin film transistor T2, a compensation transistor T3, a first initialization thin film transistor T4, an operation control thin film transistor T5, an emission control thin film transistor T6, and a second initialization thin film transistor T7.

FIG. 18 illustrates that the compensation thin film transistor T3, the first initialization thin film transistor T4, and the second initialization thin film transistor T7 may be n-channel MOSFET (NMOS), and the other thin film transistors T1, T2, T5, and T6 may be p-channel MOSFET (PMOS). In some embodiment, among the plurality of thin film transistors T1, T2, T3, T4, T5, T6, and T7, only one thin film transistor may be NMOS and the other thin film transistors may be PMOS. In another embodiment, all of the plurality of thin film transistors T1, T2, T3, T4, T5, T6, and T7 may be NMOS.

A first scan line 131 may supply a first scan signal Sm. A second scan line 153 may supply a second scan signal Sn' to the second gate electrode G3 of the compensation transistor T3. A previous scan line 151 may supply a previous scan signal Sn−1 to the first initialization thin film transistor T4. An emission control line 133 may supply an emission control signal En to the operation control thin film transistor T5 and the emission control thin film transistor T6. A following scan line 155 may supply a following scan signal Sn+1 to the second initialization thin film transistor T7. A data line 161 crossing the first scan line 131 may supply a data signal Dm to the operation control drain electrode D5 of the operation control thin film transistor T5 through the switching thin film transistor T2.

The driving voltage line 165 may supply the driving voltage ELVDD to the driving thin film transistor T1. The initialization voltage line 141 may supply an initialization voltage Vint, which initializes the pixel electrode 310, to the first thin film transistor T1.

The gate electrode G1 of the driving thin film transistor T1 may be connected to the lower electrode C1 of the storage capacitor Cst. A driving source electrode S1 of the driving thin film transistor T1 may be connected to the driving voltage line 152 via the operation control thin film transistor T5. A driving drain electrode D1 of the driving thin film transistor T1 may be electrically connected to a pixel electrode of the organic light-emitting device OLED via the emission control thin film transistor T6. The driving thin film transistor T1 may receive a data signal DM according to a switching operation of the switching thin film transistor T2, and may provide a driving current $I_{OLED}$ to the organic light-emitting device OLED.

A switching gate electrode G2 of the switching thin film transistor T2 may be connected to the first scan line 131. A switching source electrode S2 of the switching thin film transistor T2 may be connected to a data line 161. A switching drain electrode D2 of the switching thin film transistor T2, which is connected to the driving source electrode Si of the driving thin film transistor T1, may be connected to the driving voltage line 152 via the operation control thin film transistor T5. The switching thin film transistor T2 may be turned on in response to a first scan signal Sm received from the first scan line 131, and may perform a switching operation to deliver a data signal Dm, which is received from the data line 161, to the driving source electrode Si of the driving thin film transistor T1.

A compensation gate electrode G3 of the compensation thin film transistor T3 may be connected to the second scan line 153. A compensation drain electrode D3 of the compensation thin film transistor T3, which is connected to the driving drain electrode D1 of the driving thin film transistor T1, may be connected to the pixel electrode of the organic light-emitting device OLED via the emission control thin film transistor T6. A compensation source electrode S3 of the compensation thin film transistor T3 may be connected to the lower electrode C1 of the storage capacitor Cst, a first initialization drain electrode D4 of the first initialization thin film transistor T4, and a driving gate electrode G1 of the driving thin film transistor T1. The compensation thin film transistor T3 may be turned on in response to the second scan signal Sn' received through the second scan line 153, and may electrically connect the driving gate electrode G1 and the driving drain electrode D1 of the driving thin film transistor, thereby performing diode-connection on the driving thin film transistor T1.

A first initialization gate electrode G4 of the first initialization thin film transistor T4 may be connected to the previous scan line 151. A first initialization source electrode S4 of the first initialization thin film transistor T4 may be connected to a second initialization source electrode S7 of the second initialization thin film transistor T7 and the initialization voltage line 141. A first initialization drain electrode D4 of the first initialization thin film transistor T4 may be connected to the lower electrode C1 of the storage capacitor Cst, the compensation source electrode S3 of the compensation thin film transistor T3, and the driving gate electrode G1 of the driving thin film transistor T1. The first initialization thin film transistor T4 may be turned on in response to a previous scan signal Sn−1 received from the previous scan line 151, and may initialize a voltage of the driving gate electrode G1 of the driving thin film transistor T1 by supplying an initialization voltage Vint thereto.

The operation control gate electrode G5 of the operation control thin film transistor T5 may be connected to the emission control line 133, an operation control source electrode S5 of the operation control thin film transistor T5 may be connected to the driving voltage line 165, and an operation control drain electrode D5 of the operation control thin film transistor T5 may be connected to the driving source electrode T1 of the driving thin film transistor T1 and the switching drain electrode D2 of the switching thin film transistor T2.

An emission control gate electrode G6 of the emission control thin film transistor T6 may be connected to the emission control line 133, an emission control source electrode S6 of the emission control thin film transistor T6 may be connected to the driving drain electrode D1 of the driving thin film transistor T1 and the compensation drain electrode D3 of the compensation thin film transistor T3, and an emission control drain electrode D6 of the emission control thin film transistor T6 may be electrically connected to a second initialization drain electrode D7 of the second initialization thin film transistor T7 and the pixel electrode of the organic light-emitting device OLED.

The operation control thin film transistor T5 and the emission control thin film transistor T6 may be simultaneously turned on in response to the emission control signal En received from the emission control line 133, and may transmit the driving voltage ELVDD to the organic light-emitting device OLED such that the driving current $I_{OLED}$ may flow through the organic light-emitting device OLED.

A second initialization gate electrode G7 of the second initialization thin film transistor T7 may be connected to the following scan line 155, the second initialization drain electrode D7 of the second initialization thin film transistor T7 may be connected to the emission control drain electrode D6 of the emission control thin film transistor T6 and the pixel electrode 310 of the organic light-emitting device OLED, and the second initialization source electrode S7 of the second initialization thin film transistor T7 may be connected to the first initialization source electrode S4 and the initialization voltage line 141 of the first initialization thin film transistor T4. The second initialization thin film transistor T7 may be turned on in response to the following scan signal Sn+1 received from the following scan line 155, and may initialize the pixel electrode 310 of the organic light-emitting device OLED.

As illustrated in FIG. 18, the second initialization thin film transistor T7 may be connected to the following scan line 155. In another embodiment, the second initialization thin film transistor T7 may be connected to the emission control line 133, and may be driven in response to the emission control signal En. Meanwhile, positions of the source electrode Si through S7 and the drain electrodes D1 through D4 of FIG. 2 may be changed according to whether the transistor is a p-type transistor or an n-type transistor.

Figure 19:
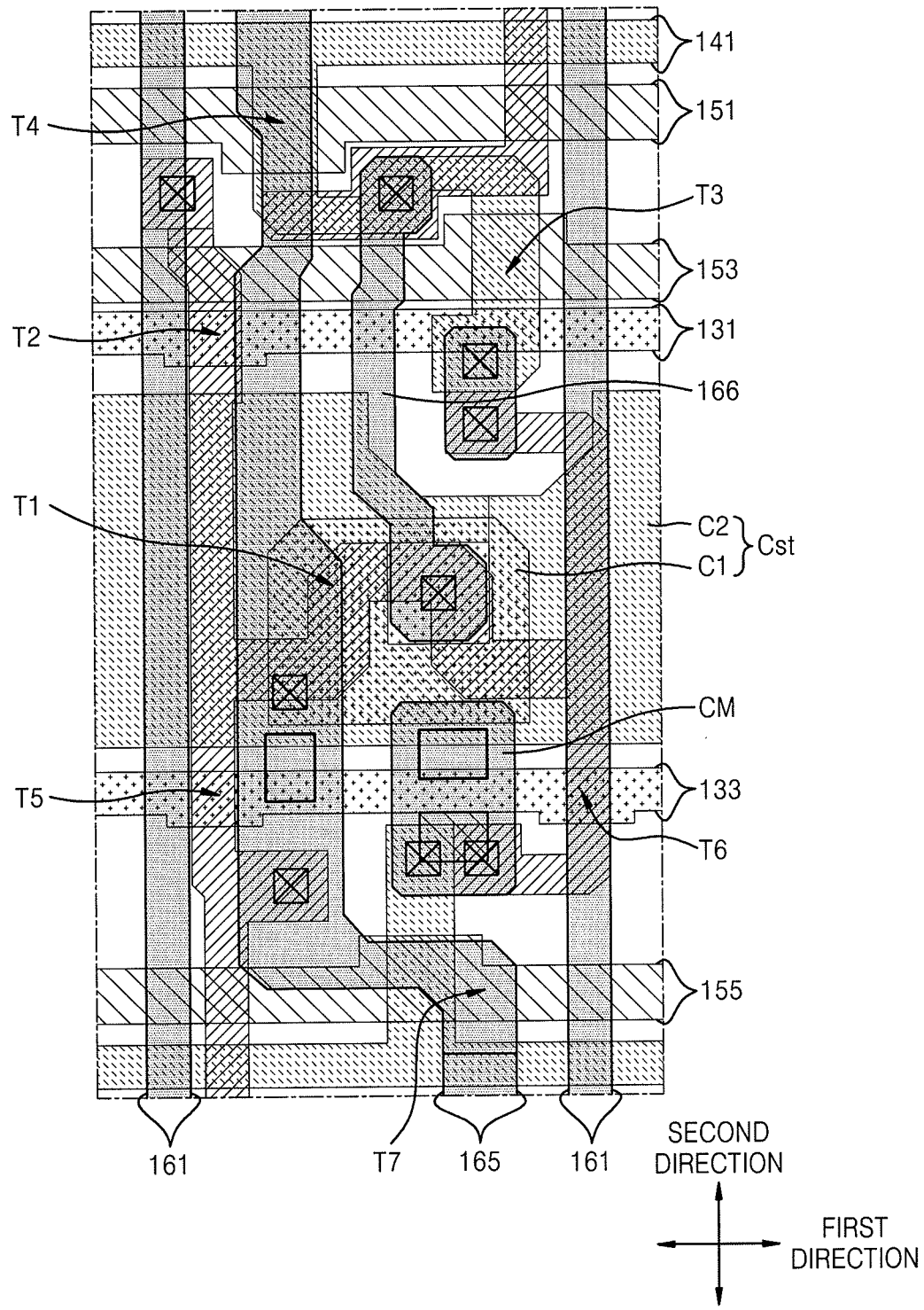
FIG. 19 illustrates a layout view of positions of a plurality of thin film transistors and a storage capacitor arranged in a pixel included in the display apparatus, according to an embodiment.

FIG. 19 illustrates a layout view of positions of a plurality of thin film transistors and a storage capacitor arranged in a pixel included in the display apparatus, according to an embodiment.

Referring to FIG. 19, a pixel in the display apparatus according to an embodiment may include the first scan line 131, the second scan line 153, the previous scan line 151, the following scan line 155, the emission control line 133, and the initialization voltage line 141 that extend in a first direction, and the data line 161 and the driving voltage line 165 extending in a second direction to cross the first scan line 131, the second scan line 153, the previous scan line 151, the following scan line 155, the emission control line 133, and the initialization voltage line 141. In the embodiment, the data line 161 may be two wires that are provided in one pixel and are separated from each other. In another embodiment, the data line 161 may be a single wire included in each pixel.

The pixel may include the driving thin film transistor T1, the switching thin film transistor T2, the compensation thin film transistor T3, the first initialization thin film transistor T4, the operation control thin film transistor T5, the emission control thin film transistor T6, the second initialization thin film transistor T7, and the storage capacitor Cst.

In the embodiment, the driving thin film transistor T1, the switching thin film transistor T2, the operation control thin film transistor T5, and the emission control thin film transistor T6 may be thin film transistors respectively including silicon semiconductors.

The compensation thin film transistor T3, the first initialization thin film transistor T4, and the second initialization thin film transistor T7 may be thin film transistors respectively including oxide semiconductors.

Semiconductor layers of the driving thin film transistor T1, the switching thin film transistor T2, the operation control thin film transistor T5, and the emission control thin film transistor T6 may be placed on one same layer, and may include same materials. For example, the semiconductor layers may be formed of, e.g., polycrystalline silicon.

The semiconductor layers of the driving thin film transistor T1, the switching thin film transistor T2, the operation control thin film transistor T5, and the emission control thin film transistor T6 may be arranged on the buffer layer 111 (as illustrated in FIG. 2) that is arranged on the substrate 110.

The semiconductor layers of the driving thin film transistor T1, the switching thin film transistor T2, the operation control thin film transistor T5, and the emission control thin film transistor T6 may be connected to one another, and may be curved or bent in various forms.

A channel area, a source area, and a drain area may be included in each of the semiconductor layers of the first thin film transistor T1, the switching thin film transistor T2, the operation control thin film transistor T5, and the emission control thin film transistor T6. The source area and the drain area may be at two opposite side of the channel area. For example, the source area and the drain area may be doped with impurities, e.g., n-type impurities or p-type impurities. The source area and the drain area respectively connected to the source electrode and the drain electrode. Hereinafter, the terms "source electrode" and "drain electrode" are respectively referred to as the terms "source area" and "drain area".

The driving thin film transistor T1 may include a driving semiconductor layer and a driving gate electrode. As the driving semiconductor layer may have a curved form, a driving channel area may be formed to be longer than each of other channel areas of other thin film transistors. For example, as the driving semiconductor layer may have a form as being curved/bent several times, e.g., an omega or the alphabet "S", the driving channel area of the driving thin film transistor T1 may have a great length in a narrow area. As the driving channel area may have the great length, a driving range of a gate voltage applied to the driving gate electrode may be increased. Thus, a gradation of light emitted from the organic light-emitting device OLED may be more elaborately controlled, and the display quality may be increased. The driving gate electrode, which is formed in an island type, may overlap the driving channel area with the first gate insulating layer 112 (in, e.g., FIG. 2) therebetween.

The storage capacitor Cst may be arranged to overlap the driving thin film transistor T1. The storage capacitor Cst may include the lower electrode C1 and the upper electrode C2. The driving gate electrode may function not only as the gate electrode of the driving thin film transistor but also as the lower electrode C1 of the storage capacitor Cst. In other words, the driving gate electrode and the lower electrode C1 may be integrated each other. The upper electrode C2 of the storage capacitor Cst may be arranged to overlap the lower electrode C1 of the storage capacitor Cst with the second gate insulating layer 113 (in, e.g., FIG. 2) therebetween.

The switching thin film transistor T2 may include a switching semiconductor layer and a switching gate electrode. A side of the switching semiconductor layer may be connected to the data line 161 through a contact hole, and another side of the switching semiconductor layer may be connected to the driving semiconductor layer. The switching gate electrode may be arranged as a part of the first scan line 131.

The operation control thin film transistor T5 may include an operation control semiconductor layer and an operation control gate electrode. A side of the operation control semiconductor layer may be connected to the driving voltage line 165 through a contact hole, and another side of the operation control semiconductor layer may be connected to the driving semiconductor layer. The operation control gate electrode may be arranged as a part of the emission control line 133.

The emission control thin film transistor T6 may include an emission control semiconductor layer and a emission control gate electrode. A side of the emission control semiconductor layer may be connected to the driving semiconductor layer, and another side of the emission control semiconductor layer may be connected to a connection electrode CM through a contact hole. The connection electrode CM may be connected to the pixel electrode 310 (in, e.g., FIG. 2) of the organic light-emitting device OLED. The emission control gate electrode may be provided as a part of the emission control line 133.

Semiconductor layers of the compensation thin film transistor T3, the first initialization thin film transistor T4, and the second initialization thin film transistor T7 may be placed on one same layer, and may include a same material. For example, the semiconductor layers may include an oxide semiconductor.

Each of the semiconductor layers may include a channel area, a source area, and a drain area. The source area and the drain area may be respectively arranged at two opposite sides of the channel area. For example, the source area and the drain area may be areas respectively having carrier concentrations increased due to a plasma treatment. The source area and the drain area may be respectively connected to the source electrode and the drain electrode. Hereinafter, the terms "source electrode" and "drain electrode" are respectively referred to as the terms "source area" and "drain area".

The compensation thin film transistor T3 may include a compensation semiconductor layer including an oxide semiconductor and a compensation gate electrode. A side of the compensation semiconductor layer may be bridge-connected to the driving gate electrode through a node connection line 166. The compensation semiconductor layer may be connected to a first initialization semiconductor layer. Another side of the compensation semiconductor layer may be connected to the driving semiconductor layer and the emission control semiconductor layer. The compensation gate electrode may be provided as a part of the second scan line 153.

The first initialization thin film transistor T4 may include the first initialization semiconductor layer including an oxide semiconductor and a first initialization gate electrode. A side of the first initialization semiconductor layer may be connected to the initialization voltage line 141, and another side of the first initialization semiconductor layer may be bridge-connected to the driving gate electrode through the node connection line 166. The first initialization gate electrode may be provided as a part of the previous scan line 151.

The second initialization thin film transistor T7 may include a second initialization semiconductor layer and the first initialization gate electrode. A side of the second initialization semiconductor layer may be connected to the initialization voltage line 141, and another side of the second initialization semiconductor layer may be connected to the emission control semiconductor layer through the third contact hole CNT3. A second initialization gate electrode may be provided as a part of the following scan line 155.

The third gate insulating layer 115 (in, e.g., FIG. 2) corresponding to each channel area may be placed between the compensation semiconductor layer and the compensation gate electrode, between the first initialization semiconductor layer and the first initialization gate electrode, and between the second initialization semiconductor layer and the second initialization gate electrode.

The interlayer insulating layer 116 (in, e.g., FIG. 2) may be arranged on the thin film transistors T3, T4, and T7 respectively including the oxide semiconductors, and the data line and the driving voltage line 165 may be arranged on an upper area of the interlayer insulating layer 116 (in, e.g., FIG. 2).

In the embodiment, the initialization voltage line 141 and the oxide semiconductor layers may be provided on the same layer, and may be formed of the same material. In another embodiment, the initialization voltage line 141 and the driving gate electrode may be arranged on the same layer. In some embodiment, the initialization voltage line 141 and the upper electrode C2 of the storage capacitor Cst may be provided on the same layer, and may be formed of the same material.

In an embodiment, the first scan line 131 and the emission control line 133 may be formed of the same material, and may be formed on a same layer. The driving gate electrode, and the data line 163, the driving voltage line 165, the node connection line 166, and the connection electrode 167 may be formed of the same material, and may be formed on a same layer as one another.

The display apparatuses 10, 20, 30, 40, 50, and 60 according to the embodiments may respectively include the first thin film transistors T1 including the silicon semiconductors and the second thin film transistors T2 including the oxide semiconductors. Thus, power consumptions of the display apparatuses 10, 20, 30, 40, and 50 may be decreased, and may have high quality.

In addition, the display apparatuses 10, 20, 30, 40, 50, and 60 according to the embodiments may respectively include the storage capacitors Cst at least partially overlapping the first thin film transistor T1. As the second semiconductor layer AO2 of the second thin film transistor and one of the electrodes of the storage capacitor Cst may be placed on the same layer, the process time and the process cost for the display apparatuses 10, 20, 30, 40, 50, and 60 may be reduced, and the display apparatuses 10, 20, 30, 40, and 50 may have high integration densities.

While one or more embodiments have been described with reference to the figures, it will be understood by those of ordinary skill in the art that various changes in forms and details may be made therein without departing from the spirit and scope as defined by the following claims. Therefore, the scope of the present disclosure is defined not by the detailed description of the present disclosure but by the appended claims.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
   a substrate including a first area, a second area, and a bending area between the first area and the second area;
   a first thin film transistor and a second thin film transistor disposed in the first area; and
   a storage capacitor comprising a lower electrode and an upper electrode disposed in the first area, wherein
   the first thin film transistor has a first semiconductor layer,
   the second thin film transistor has a second semiconductor layer including an oxide semiconductor layer and a second gate electrode insulated from the second semiconductor layer by a first insulating layer,
   the first semiconductor layer and the second semiconductor layer are disposed in different layers, and
   the second semiconductor layer and the upper electrode are arranged directly on a same insulating layer and the upper electrode includes an oxide semiconductor material.

2. The display apparatus as claimed in claim 1, wherein the lower electrode is electrically connected to a first gate electrode of the first thin film transistor.

3. The display apparatus as claimed in claim 2, further comprising:
   a second insulating layer arranged between the first gate electrode and the second semiconductor layer, wherein
   the lower electrode and the first gate electrode are formed in one body, and the upper electrode is arranged on the second insulating layer.

4. The display apparatus as claimed in claim 3, further comprising:
   a planarization layer covering the first gate electrode and the second gate electrode.

5. The display apparatus as claimed in claim 2, further comprising:
   a connection wire extending from the first area to the second area;
   an inner wire formed in the first area; and
   an outer wire formed in the second area, wherein
   the connection wire is electrically connecting the inner wire with the outer wire.

6. The display apparatus as claimed in claim 5, wherein parts of the inner wire and the outer wire are arranged on a same layer, and
   the inner wire, the outer wire, and the first gate electrode include a same material.

7. The display apparatus as claimed in claim 5, wherein parts of the inner wire and the outer wire are arranged on a same layer, and
   the inner wire and the second gate electrode include a same material.

8. The display apparatus as claimed in claim 1, wherein the first thin film transistor is a driving transistor that drives a light-emitting device.

9. A display apparatus comprising:
   a substrate including a first area, a second area, and a bending area between the first area and the second area, the bending area bent;
   a first thin film transistor and a second thin film transistor disposed in the first area; and
   a storage capacitor comprising a lower electrode and an upper electrode disposed in the first area, wherein
   the second thin film transistor has a second semiconductor layer including an oxide semiconductor layer and a second gate electrode insulated from the second semiconductor layer by a first insulating layer, and
   a first gate electrode and the second semiconductor layer are insulated by a second insulating layer, and
   the second gate electrode and upper electrode are arranged directly on a same insulating layer and formed of a same material.

10. The display apparatus as claimed in claim 9, wherein the lower electrode is electrically connected to the first gate electrode.

11. The display apparatus as claimed in claim 10, further comprising:
a planarization layer covering the first gate electrode and the second gate electrode.

12. The display apparatus as claimed in claim 9, further comprising:
a connection wire extending from the first area to the second area;
an inner wire formed in the first area; and
an outer wire formed in the second area, wherein
the connection wire is electrically connecting the inner wire with the outer wire.

13. The display apparatus as claimed in claim 12, wherein parts of the inner wire and the outer wire are arranged on a same layer, and wherein the inner wire, the outer wire, and the first gate electrode include a same material.

14. The display apparatus as claimed in claim 12, wherein parts of the inner wire and the outer wire are arranged on a same layer, and wherein the inner wire and the second gate electrode include a same material.

15. A display apparatus comprising:
a substrate including a first area, a second area, and a bending area between the first area and the second area;
a first thin film transistor disposed in the first area and comprising a first semiconductor layer and a first gate electrode;
a second thin film transistor disposed in the first area and comprising a second semiconductor layer and a second gate electrode insulated from the second semiconductor layer by a first insulating layer;
a storage capacitor comprising a lower electrode and an upper electrode disposed in the first area;
an inner wire electrically connected to the first thin film transistor or the second thin film transistor;
a second insulating layer covering the first gate electrode and the second gate electrode and having contact holes; and
a connection wire disposed in the bending area, extended from the first area to the second area, and electrically connected to the inner wire and an outer wire through one of the contact holes, wherein
the second semiconductor layer includes an oxide semiconductor layer,
the second semiconductor layer and one of the lower electrode and the upper electrode are arranged directly on a same insulating layer, and
the upper electrode includes an oxide semiconductor material.

16. The display apparatus as claimed in claim 15, wherein the lower electrode is electrically connected to a first gate electrode.

17. The display apparatus as claimed in claim 16, further comprising:
a third insulating layer arranged between the first gate electrode and the second semiconductor layer, wherein
the lower electrode and the first gate electrode are formed in one body, and
the upper electrode is arranged on the third insulating layer.

18. The display apparatus as darned in claim 17, further comprising:
a first opening or a first groove over the bending area in the third insulating layer.

19. The display apparatus as claimed in claim 18, wherein parts of the inner wire and the outer wire are arranged on a same layer and the inner wire, the outer wire, and the second gate electrode include a same material.

20. The display apparatus as claimed in claim 18, further comprising:
a second opening or a second groove over the bending area in the second insulating layer.

21. The display apparatus as claimed in claim 20, wherein parts of the inner wire and the outer wire are arranged on a same layer and the inner wire, the outer wire, and the second gate electrode include a same material.

* * * * *